(12) United States Patent
Gong et al.

(10) Patent No.: US 10,193,549 B2
(45) Date of Patent: Jan. 29, 2019

(54) SENSING APPARATUS

(71) Applicant: Samsung Electronics Co., Ltd., Suwon-si, Gyeonggi-do (KR)

(72) Inventors: Nan-Wei Gong, Cambridge, MA (US); Tobias Rick, Mountain View, CA (US); Arun Rakesh Yoganandan, San Francisco, CA (US); Henry Holtzman, San Francisco, CA (US); Jae Woo Chung, San Francisco, CA (US); Kumi Akiyoshi, San Francisco, CA (US)

(73) Assignee: Samsung Electronics Co., Ltd., Suwon-si (KR)

( * ) Notice: Subject to any disclaimer, the term of this patent is extended or adjusted under 35 U.S.C. 154(b) by 35 days.

(21) Appl. No.: 14/983,405

(22) Filed: Dec. 29, 2015

(65) Prior Publication Data
US 2017/0187377 A1 Jun. 29, 2017

(51) Int. Cl.
| | |
|---|---|
| *G06F 3/044* | (2006.01) |
| *H03K 17/955* | (2006.01) |
| *G06F 1/16* | (2006.01) |
| *G06F 3/01* | (2006.01) |
| *G06F 3/0346* | (2013.01) |
| *H05K 1/18* | (2006.01) |
| *H05K 1/02* | (2006.01) |

(52) U.S. Cl.
CPC .......... *H03K 17/955* (2013.01); *G06F 1/169* (2013.01); *G06F 1/1616* (2013.01); *G06F 3/017* (2013.01); *G06F 3/0346* (2013.01); *H05K 1/189* (2013.01); *G06F 3/044* (2013.01); *H03K 2217/96015* (2013.01); *H05K 1/028* (2013.01); *H05K 2201/053* (2013.01); *H05K 2201/10151* (2013.01)

(58) Field of Classification Search
CPC ......... G01B 11/00; G01B 11/22; G01S 11/00; G01S 11/12; H04N 13/0022; H04N 13/0239; H04N 13/0253; H04N 13/0271; H04N 5/2226; H04N 5/2258; H04N 5/332; H04N 9/045; H04N 9/09; G06F 1/1616; G06F 3/017
USPC .................................................. 345/173–179
See application file for complete search history.

(56) References Cited

U.S. PATENT DOCUMENTS

| | | | |
|---|---|---|---|
| 8,890,839 | B2 | 11/2014 | Santarossa |
| 9,024,870 | B2 | 5/2015 | Kim et al. |
| 9,024,907 | B2 | 5/2015 | Bolender |
| 9,041,663 | B2 | 5/2015 | Westerman |
| 9,063,577 | B2 | 6/2015 | Hodges et al. |
| 2004/0046739 | A1* | 3/2004 | Gettemy ............... G06F 1/1626 345/158 |
| 2006/0007171 | A1 | 1/2006 | Burdi et al. |

(Continued)

FOREIGN PATENT DOCUMENTS

CN          104485971 A  *  4/2015

*Primary Examiner* — Michael Faragalla
*Assistant Examiner* — Sujit Shah

(57) ABSTRACT

In one aspect, a modular sensing apparatus will be described. The modular sensing apparatus includes a flexible substrate and multiple sensors. The flexible substrate is reconfigurable into different shapes that conform to differently shaped structures. The multiple sensors are positioned on the substrate. Various embodiments relate to software, devices and/or systems that involve or communicate with the modular sensing apparatus.

19 Claims, 14 Drawing Sheets

(56) References Cited

U.S. PATENT DOCUMENTS

| | | | |
|---|---|---|---|
| 2006/0205507 A1* | 9/2006 | Ho | A63F 13/02 |
| | | | 463/39 |
| 2006/0238517 A1 | 10/2006 | King et al. | |
| 2009/0058822 A1* | 3/2009 | Chaudhri | G06F 3/04883 |
| | | | 345/173 |
| 2009/0139778 A1 | 6/2009 | Butler et al. | |
| 2010/0219943 A1* | 9/2010 | Vanska | G06F 1/163 |
| | | | 340/407.1 |
| 2010/0321289 A1* | 12/2010 | Kim | G06F 1/1626 |
| | | | 345/156 |
| 2012/0044199 A1 | 2/2012 | Karpin et al. | |
| 2012/0194448 A1* | 8/2012 | Rothkopf | A45C 13/002 |
| | | | 345/173 |
| 2012/0275621 A1 | 11/2012 | Elko | |
| 2013/0027319 A1* | 1/2013 | Hand | H04M 1/67 |
| | | | 345/173 |
| 2013/0027349 A1 | 1/2013 | Sanatarossa | |
| 2013/0038560 A1 | 2/2013 | Sato et al. | |
| 2013/0162517 A1 | 6/2013 | Gay | |
| 2013/0234970 A1 | 9/2013 | Hodges et al. | |
| 2014/0055483 A1* | 2/2014 | Pance | G06F 1/3231 |
| | | | 345/589 |
| 2014/0104160 A1* | 4/2014 | Eriksson | G06F 3/042 |
| | | | 345/156 |
| 2014/0106814 A1* | 4/2014 | Schmidt | H04W 88/02 |
| | | | 455/556.1 |
| 2014/0132553 A1* | 5/2014 | Park | G06F 3/044 |
| | | | 345/174 |
| 2014/0152890 A1* | 6/2014 | Rayner | G06F 1/1626 |
| | | | 348/376 |
| 2015/0109243 A1 | 4/2015 | Jun et al. | |
| 2015/0153862 A1 | 6/2015 | Nakamura et al. | |
| 2015/0223355 A1* | 8/2015 | Fleck | H05K 5/026 |
| | | | 361/679.03 |

\* cited by examiner

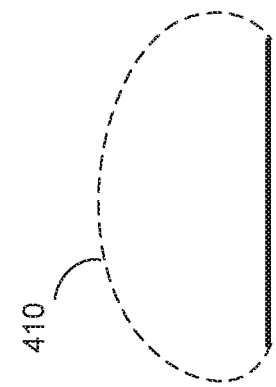
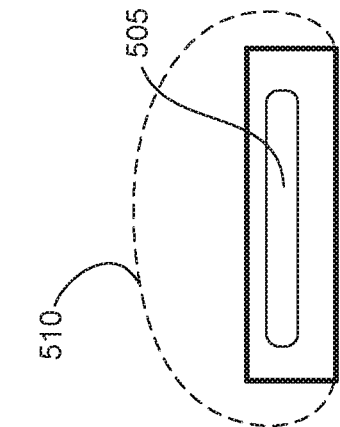
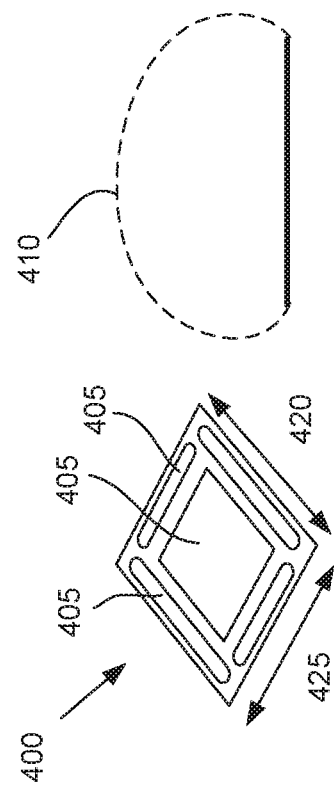
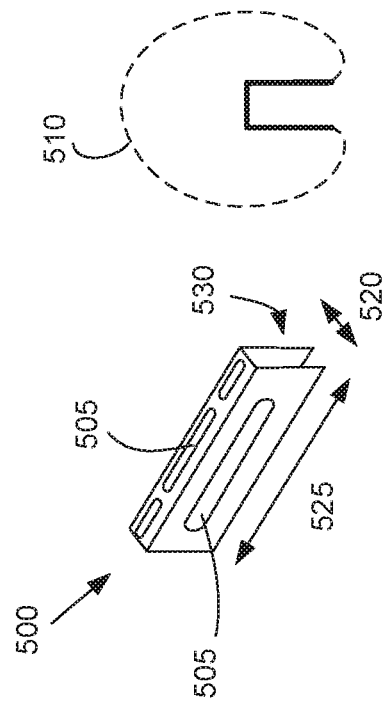

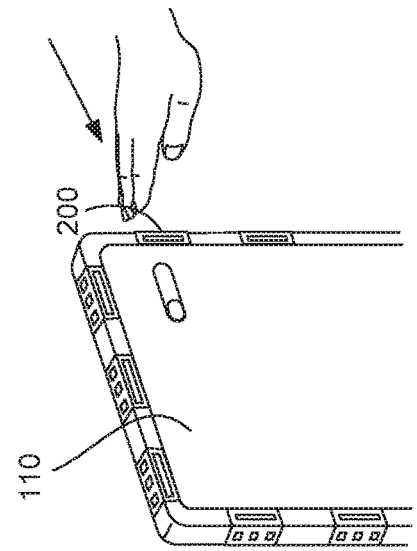
FIG. 9A
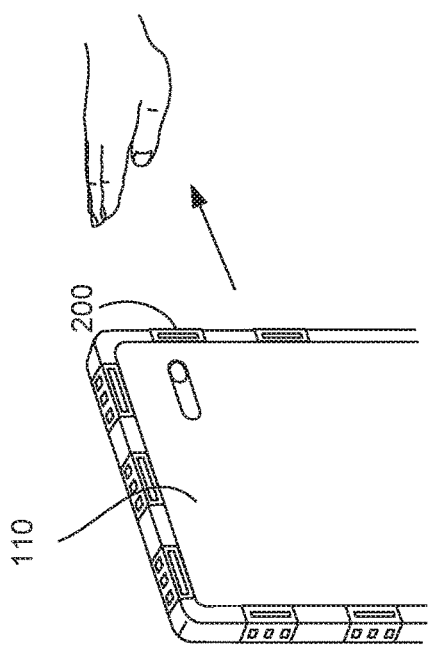
FIG. 9B
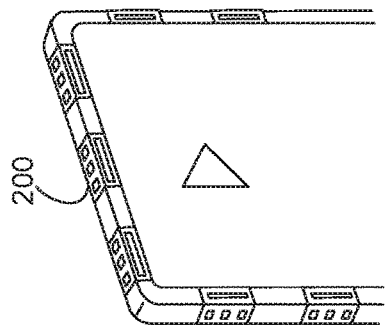
FIG. 10A
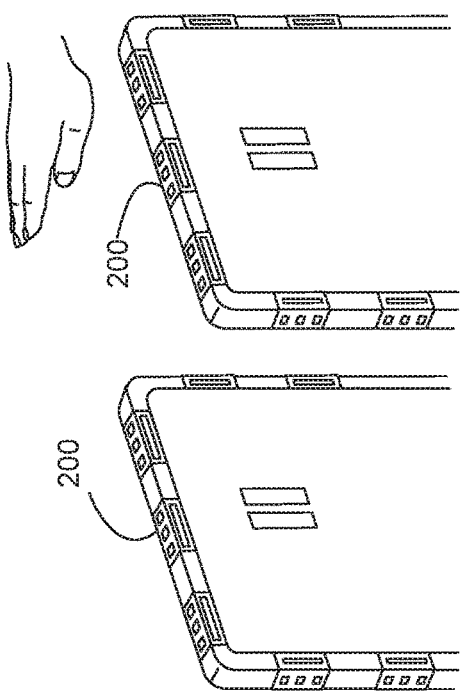
FIG. 10B
FIG. 10C

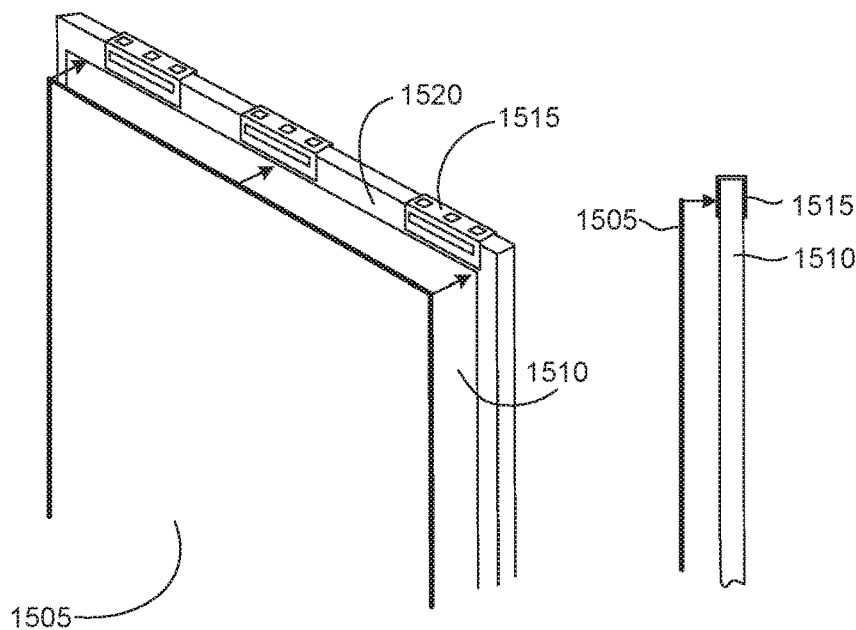
FIG. 15A  FIG. 15B
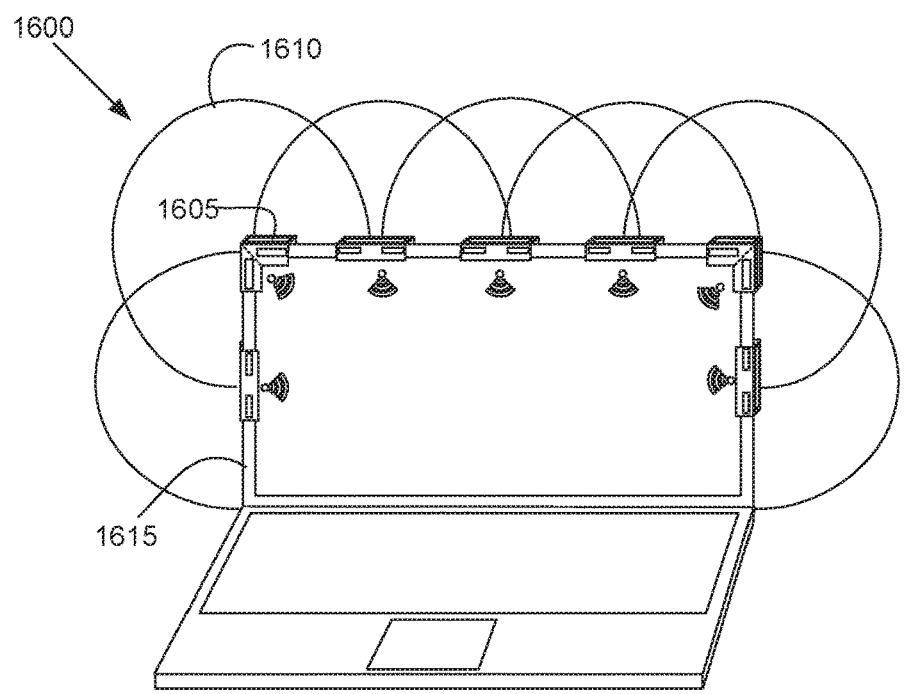
FIG. 16

SENSING APPARATUS

FIELD OF THE INVENTION

The present invention relates generally to sensor technologies. Various embodiments of the present invention relate to a modular sensing apparatus.

BACKGROUND

There are a variety of ways to interact with electronic devices. For example, hardware such as keyboards and mice are often used to provide input to a computer. Smartphone and tablets typically have several mechanical buttons that trigger particular functions. Additionally, modern smartphones and tablets often include touch sensitive screens. Users can interact with the devices by tapping or swiping across the screen.

Technologies have been developed to allow a user to interact with a device without touching it. For example, the Microsoft Kinect® is a device that includes an optical sensor. A user can control a television by standing in front of the optical sensor. For example, the user can wave his or her hand to move to another section of a user interface. There are continuing efforts to develop still other ways of interacting with electronic devices.

SUMMARY

In one aspect, a modular sensing apparatus will be described. The modular sensing apparatus includes a flexible substrate and multiple sensors. The flexible substrate is reconfigurable into different shapes that conform to differently shaped structures. The multiple sensors are positioned on the substrate.

In another aspect of the invention, a device is described. In various embodiments, the device is a laptop, a television, a display screen or any other suitable electronic/display device. The device includes at least two adjacent surfaces that form a corner. The device also includes at least one processor and memory circuitry that is arranged to store computer code. The computer code, when executed by the processor(s), causes the device to perform various operations. The operations include obtaining sensor data from multiple sensors. At least one of the sensors is positioned over each of the adjacent surfaces that form a corner of the device. Based on the sensor data, a motion is determined that extends over the two adjacent surfaces. Based on the determined motion, an operation is performed.

In another aspect of the invention, a method is described. Sensor data is obtained from multiple sensors that are positioned on adjacent surfaces of a device. Based on the sensor data received from the sensors, a continuous motion is determined that extends over at least two of the adjacent surfaces of the device. Based on the detected motion, a device command and/or other motion-related data is transmitted.

BRIEF DESCRIPTION OF THE DRAWINGS

The invention and the advantages thereof, may best be understood by reference to the following description taken in conjunction with the accompanying drawings in which:

FIGS. 4A-4C are diagrams of a modular sensing apparatus and associated motion detection zones according to a particular embodiment of the present invention.

FIGS. 5A-5C are diagrams of a modular sensing apparatus and associated motion detection zones according to another embodiment of the present invention.

FIGS. 9A-9B, 10A-10C and 11A-11B are diagrams illustrating various ways of interacting with a device and a modular sensing apparatus according to various embodiments of the present invention.

FIGS. 15A and 15B are perspective and side views of a display panel, display screen and modular sensing apparatus according to a particular embodiment of the present invention.

FIG. 16 is a diagram of a device with multiple modular sensing apparatuses that form a sensor network according to a particular embodiment of the present invention.

DETAILED DESCRIPTION

The present invention relates to devices, methods, systems and arrangements for sensing motion around a device. As noted in the Background, there are currently a variety of ways (e.g., touch, mechanical buttons, optical sensors, etc.) to interact with electronic devices. While these approaches are useful for many applications, they have their disadvantages as well. For example, touching a screen on a tablet or laptop can make the screen dirty over time. Also, if touch is used to control a device, this typically means that a user interface must be displayed on the device so that a user knows where to touch the screen. In some applications, such as when watching a movie on a tablet, this either blocks or shrinks the media that is shown, which can be undesirable.

As noted in the Background, an optical sensor can also be used to detect motion, which in turn can be used to control a device, such as a television or a game console. Optical sensors have limitations as control systems as well, however. Generally, to be detected by an optical sensor, a user has to gesture directly in line of sight from the optical emitter. Motions to the side of the optical sensor generally are not detected. For various applications involving a display screen (e.g., a television or a laptop) and a forward-facing optical sensor or camera, gestures generally must be performed in front of the screen, and not to the side or behind the screen.

Figure 1A:
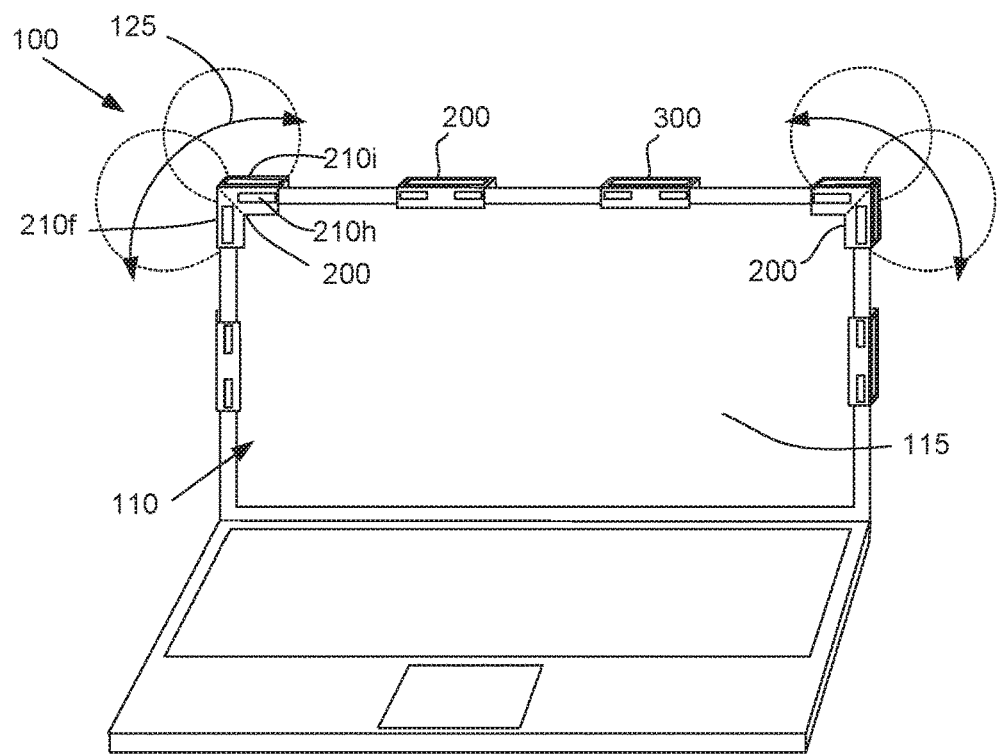
FIGS. 1A-1C are front and side views of a device with module sensing apparatuses according to a particular embodiment of the present invention.
Figure 1B:
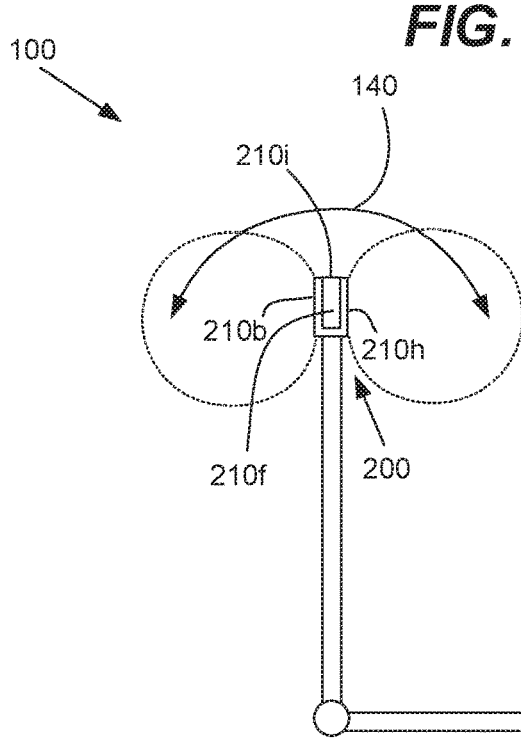

Various implementations of the present invention address one or more of the above issues. Referring initially to FIGS. 1A and 1B, a device 100 using modular sensing apparatuses 200 according to a particular embodiment of the present invention will be described. FIGS. 1A and 1B provide front and side views of a device 100, which in the illustrated embodiment is a laptop, but may be any suitable electronic or computing device, such as a computer, tablet, television, etc. In this example, the device 100 includes a display panel 110 with a display screen 115 on its front surface.

There are multiple modular sensing apparatuses 200 positioned on the perimeter of the display panel 110. The modular sensing apparatuses may be positioned in any suitable location on the device 100 (e.g., overlapping portions of the display panel, positioned on or around the bezel of a device, monitor or display panel, etc.) Each module sensing apparatus is designed to be reconfigurable. That is, the apparatus 200 can be configured from one shape/configuration to another, and/or back again as needed. In the illustrated embodiment, for example, each modular sensing apparatus can be unfolded to form a substantially flat, co-planar panel. However, the apparatus can also be folded to form a structure that conforms to the corners and edges of the display panel 110. The apparatuses 200 shown in FIGS. 1A and 1B are in such a configuration.

The ability to shift between various configurations is advantageous for various reasons. For one, it allows the modular sensing apparatus to be attached with or placed on multiple different types of surfaces and structures e.g., corners, edges, bevels of a screen, etc. In the illustrated embodiment, for example, some of the modular sensing apparatuses have been configured to fit onto the top rim of the display panel. Other module sensing apparatuses have been configured to conform to the top corners of the display panel.

Another advantage relates to motion detection. Each modular sensing apparatus includes multiple sensors. When the modular sensing apparatus is reconfigured into different shapes, the faces of the sensors face in different directions. This allows the apparatus to detect motion that takes place around, behind, to the sides and/or at corners of the display panel 110.

In the illustrated embodiment, for example, the modular sensing apparatus 200 at the left corner of the display panel has a front sensor 210$h$, a top sensor 210$i$, a side sensor 210$f$ and a back sensor 210$b$ (not shown). If there is a motion (e.g., a hand wave) that moves around the top left corner (e.g., as indicated by arrow 125), the apparatus 200 can detect such a motion using the top sensor 210$i$ and the side sensor 210$f$. Similarly, if there is a motion that sweeps from the front of the display panel 110 to the back (e.g., as indicated by the arrow 140 of FIG. 1B), the apparatus can detect the motion using the front, top and back sensors. In some embodiments, each sensor is constantly sensing and generating sensor data, and the apparatus 200 detects a significant motion by determining which sensors are generating sensor data that indicates a significant motion, as opposed to noise or insignificant or unimportant motions/events. The sensor data from those sensors is used to determine the nature of the significant motion. Thus, motion detection is not limited to a region in front of the display screen 115, as is often the case with laptops or televisions that use a single front-facing optical sensor. The above system allows a user to control the device 100 using a variety of different motions that can be made in a variety of locations around the device 100 and/or the modular sensing apparatus 200.

The modular sensing apparatuses 200 may be positioned and/or coupled with the underlying device 100 in any suitable manner. In some embodiments, for example, the apparatus 200 rests or hangs on the device 100, possibly without being directly secured to the device. In other embodiments, the apparatus is attached with the device 100 using a fastener, a clamp, a magnet, an adhesive or any other suitable attachment or fastening mechanism.

Figure 2A:
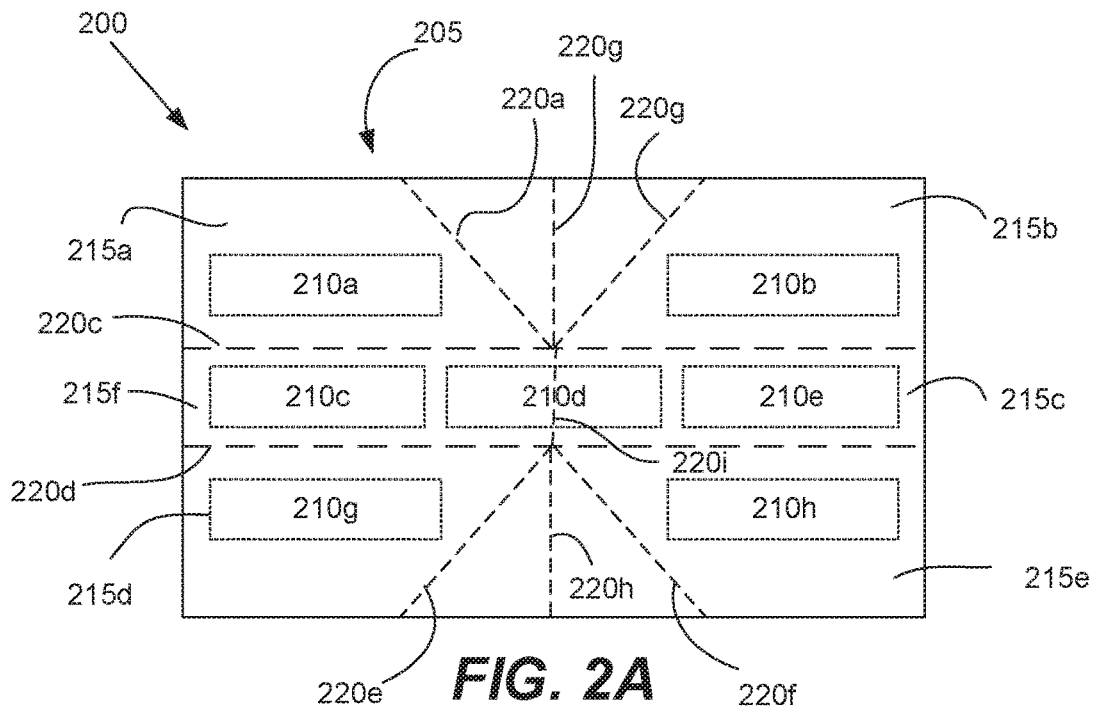
FIGS. 2A-2D are diagrams of a modular sensing apparatus according to a particular embodiment of the present invention.
Figure 2B:
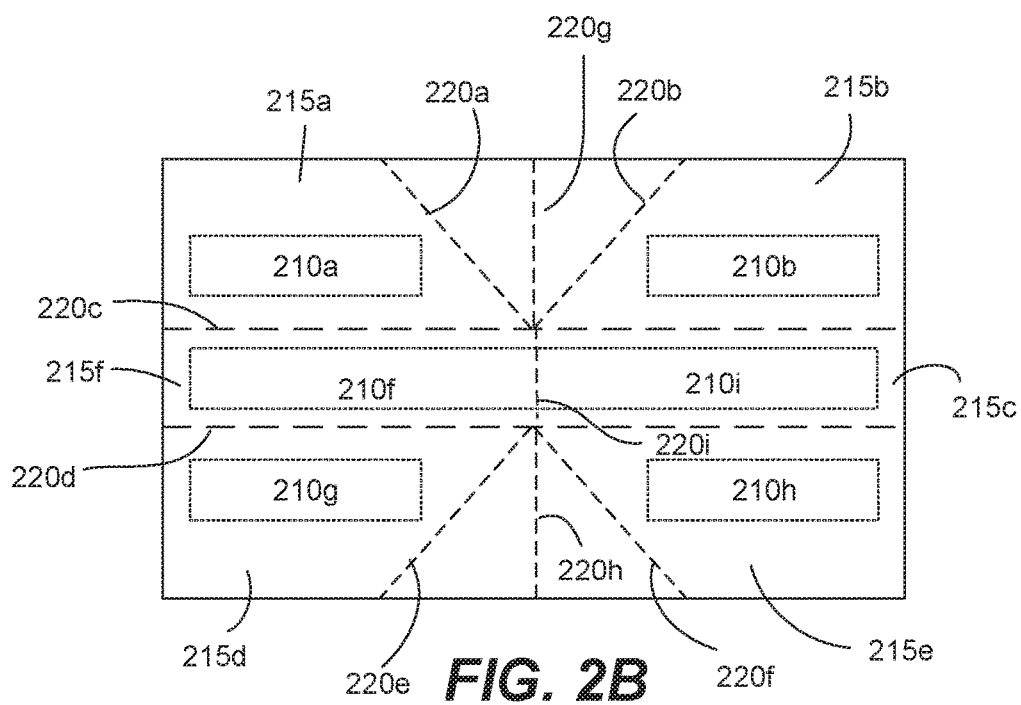

Referring next to FIGS. 2A and 2B, a modular sensing apparatus 200 according to a particular embodiment of the present invention will be described. The modular sensing apparatus 200 includes a flexible substrate 205 and multiple sensors 210$a$-$h$. The modular sensing apparatus 200 may be the apparatus 200 illustrated in FIGS. 1A-1B.

Figure 12:
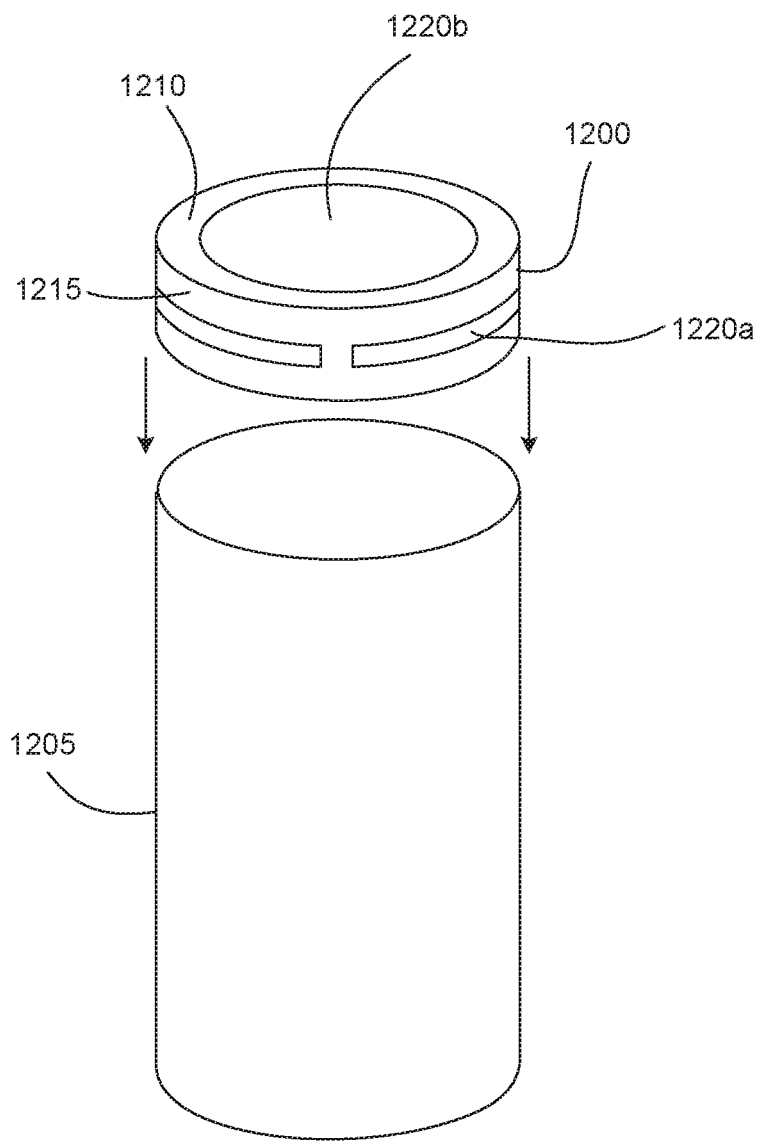
FIG. 12 is a diagram of a cylindrical device and a modular sensing apparatus according to a particular embodiment of the present invention.

The flexible substrate 205 may be made of any suitable, non-conductive material e.g., a flexible printed circuit board. The nature and extent of the flexibility of the substrate 205 may vary between different designs. In some embodiments, for example, the substrate 205 is elastic and/or bendable such that it can be reshaped to form a curve or a loop (e.g., as seen in FIG. 12.)

In the illustrated embodiment, the substrate 205 includes multiple plates 215$a$-$e$. Each plate is generally rigid and substantially flat. In various implementations, each plate includes a stiffener to provide additional physical support, although this is not a requirement. The plates are coupled with connecting mechanisms 220$a$-$i$ (e.g., as indicated by the dotted lines in the figure.) The substrate 205 can be folded along these connecting mechanisms. In this manner, the modular sensing apparatus 200 can be reconfigured into different shapes to accommodate different types of surfaces or structures.

The connecting mechanisms 220$a$-$h$ may take any suitable form. In some embodiments, they are mechanical hinges. In still other embodiments, the connecting mechanisms involve a cutting line, a folding line, a seam, etc. A cutting line is any connecting mechanism or structure that facilitates cutting along a line or in a particular region of the device. By way of example, the cutting line may be a line that is perforated and/or formed from a weaker material than the rest of the surrounding substrate. A folding line is any connecting mechanism or structure that facilitates folding. For example, a folding line may involve a mechanical hinge, a seam or any suitable flexible material that helps couple different plates together. Generally, the connecting mechanism may be any structure or mechanism that allows for bending, folding, movement and/or cutting at a region or line that is positioned between at least two of the plates/sections of the apparatus 200.

The sensors 210$a$-$i$ of the modular sensing apparatus 200 are arranged to detect motion within a range of the sensors. Any suitable sensor may be used. In various embodiments, capacitive sensors are used. Generally, a capacitive sensor is capable of detecting motion in a region that overlies a face of the sensor (although the sensor may also detect motion above and to the side of the face of the sensor, as will be discussed in further detail later in the application in connection with FIGS. 4A-4C and 5A-5C.) When the modular sensing apparatus 200 is reconfigured to cover multiple sides of a device 100 with multiple sensors, motion can then be detected in multiple regions around the device 200.

Any suitable type of capacitive sensor may be used. In various implementations, the capacitive sensor is arranged to detect a change in an electric field/capacitance in a region above the sensor. In some embodiments, the capacitive sensor includes a transmitter and a receiver. The transmitter is arranged to emit one or more frequencies to avoid cross-talk or interference of the switching frequency of an underlying device e.g., the display. The receiver is arranged to detect changes in an electric field/capacitance caused by the motion.

Each plate may have none, one or more than one sensor. Any suitable number of sensors may be positioned on a plate, depending on the needs of a particular application. In some applications, the more sensors there are, the finer the resolution of the sensor detection. As will be discussed later in the application (e.g., in connection with FIGS. 4A-4C and 5A-5C), it can sometimes be advantageous to position multiple sensors in a row or array rather than using a single sensor to cover the same region. That is, even though the multiple sensors are separated by regions of substrate, if the sensors are properly positioned, there may not be any breaks in their coverage of a region above the sensors.

It should be noted that in FIGS. 2A and 2B, the modular sensing apparatus 200 is in a flat configuration. That is, there are no folds along the connecting mechanisms 220. All of the plates of the modular sensing apparatus and/or the entire substrate form a single, substantially co-planar surface. The sensors face generally in the same direction i.e., upward and out of the page, and in this example, the face of each sensor is substantially co-planar with the surface of its surrounding/underlying plate.

Figure 2C:
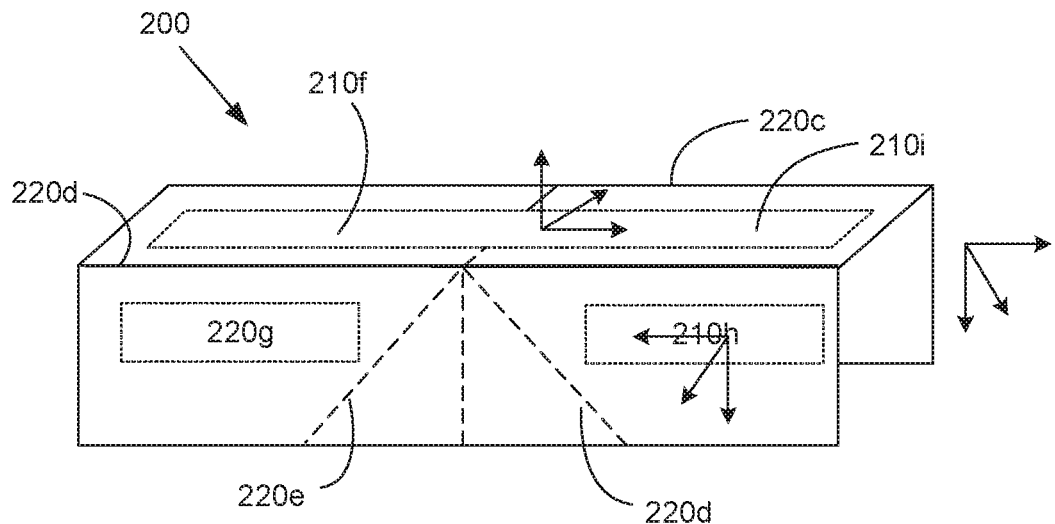

In FIG. 2C, the modular sensing apparatus 200 is in a different, folded configuration. In this folded configuration, the modular sensing apparatus 200 is folded along connecting mechanisms 220c and 220d f FIG. 2B. Put another way, plates 215c/f, which support sensors 210f and 210i, form a top surface. Plates 215d/e and 215a/b, which support sensors 210g/h and 210a/b, respectively, form side surfaces. In the illustrated embodiment, the folding allows the side surfaces and their associated plates to be substantially perpendicular to the top surface and its associated plates. This particular configuration is arranged to conform to and cover a rim of a device (e.g., a rim of a display panel, as indicated in FIGS. 1A-1B.)

Because of the change in configuration, the sensors in FIG. 2C face in different directions and detect motion in different regions relative to the embodiment illustrated in FIG. 2B. For example, in FIG. 2C, the sensor 210f continues to face upward. The bending of the substrate along the connecting mechanisms 220c/d, however, enables sensors 210g and 210a to face in a direction to the side of the sensor 210f. Thus, sensors 210g and 210a are arranged to detect motion in a side region where the sensor 210f is incapable of detecting motion due to its current orientation.

Figure 2D:
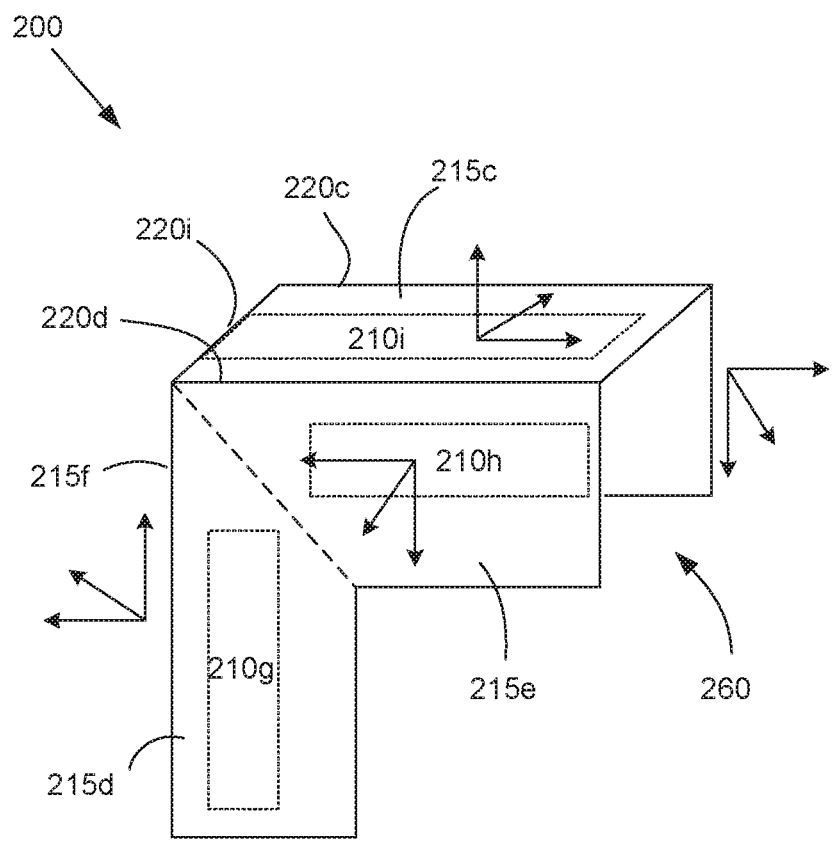

Referring next to FIG. 2D, the modular sensing apparatus 200 is in a different, corner conforming configuration. That is, the modular sensing apparatus 200 illustrated in FIG. 2B has been reconfigured to conform to a corner of a device e.g., a corner of a display panel 110, as illustrated in FIG. 1A. In this example, the modular sensing apparatus 200 illustrated in FIG. 2B has been folded along connection mechanisms 220a, 220b, 220e, 220f and 220i. In this example, no folding occurs along connecting mechanisms 220c and 220d.

As a result, in this example, plate 215c forms a top surface. Plates 215d/e and 215a/b form front and back surfaces, respectively, that are substantially parallel to one another and extend substantially perpendicular to the top surface. The surfaces of plates 215d and 215e are substantially coplanar, as are the surfaces of plates 215a and 215b. Plates 215d/e cooperate to form a front surface, and plates 215 a/b cooperate to form an opposing back surface. Plate 215f forms a side surface, which is arranged to be substantially perpendicular to the top, back and front surfaces. The above arrangement of plates and surfaces forms a trench 260 that is arranged to be filled with and fit a corner of a device (e.g., a corner of display panel on a tablet or laptop.) In this corner conforming configuration, the modular sensing apparatus is reconfigured to conform to a corner of a device such that four adjacent surfaces that help form the corner of the device (e.g., surfaces) are all covered by the modular sensing apparatus 200.

Figure 1C:
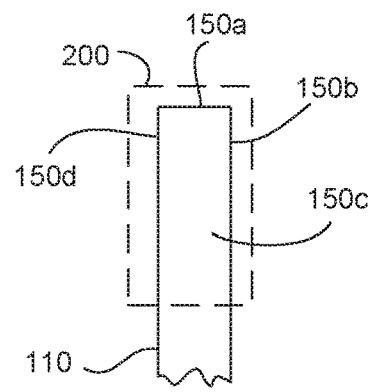

An example of such an arrangement is illustrated in FIG. 1C. FIG. 1C is a diagram that is an enlarged view of a corner portion of the device 100 illustrated in FIG. 1B. In this example, modular sensing apparatus 200 in FIG. 1B should be understood to have the same features and structure as modular sensing apparatus 200 in FIG. 2D. In FIG. 1C, the modular sensing apparatus 200 is drawn to be transparent so that the top surface 150a, parallel front and back surfaces 150b/150d, and side surface 150d of a display panel 110 are shown. The top, front, back and side surfaces cooperate to form a corner of the display panel 110. This corner fits into the trench formed by the folding of the modular sensing apparatus 200 into the corner-conforming configuration shown in FIG. 2C.

This arrangement allows the modular sensing apparatus 200 to detect motion from various angles at a corner of a device. Because of the placement of the sensors on each of the sides of the corner, the modular sensing apparatus 200 is arranged to detect motions that sweep from the front of the corner to the back of the corner (e.g., as indicated by arrow 140 in FIG. 1B) as well as motions that extend around the side of the corner (e.g., as indicated by arrow 125 in FIG. 1A.) Put another way, sensors 210h, 210i and 210b cooperate to detect all parts of the front-to-back motion (e.g., as indicated by arrow 140). Sensors 210i and 210f cooperate to detect all parts of the around-the-side motion (e.g., as indicated by arrow 125) An individual plate and its associated sensors is not sufficient to detect the entire motion; rather, each of the above sensors detects a portion of the motion, and the aforementioned sets of two or three sensors thus collaborate to detect the entire motion.

It should be noted that a wide variety of motions may be detected and used to trigger a particular command or operation, and are not limited to the examples described herein. For example, other possible motions include but are not limited to motions that extend from a back of the corner to a side of the corner, or a side of the corner to the front of the corner. Any suitable motion that passes over any combination of surfaces or sensors on the modular sensing apparatus may be detected.

Figure 3A:
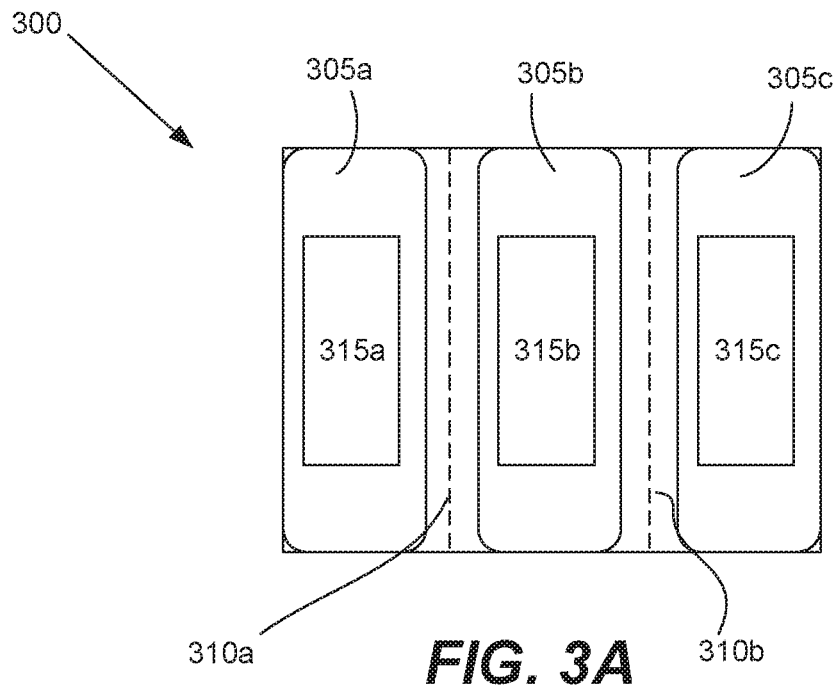
FIGS. 3A-3B are diagrams of a modular sensing apparatus according to another embodiment of the present invention.
Figure 3B:
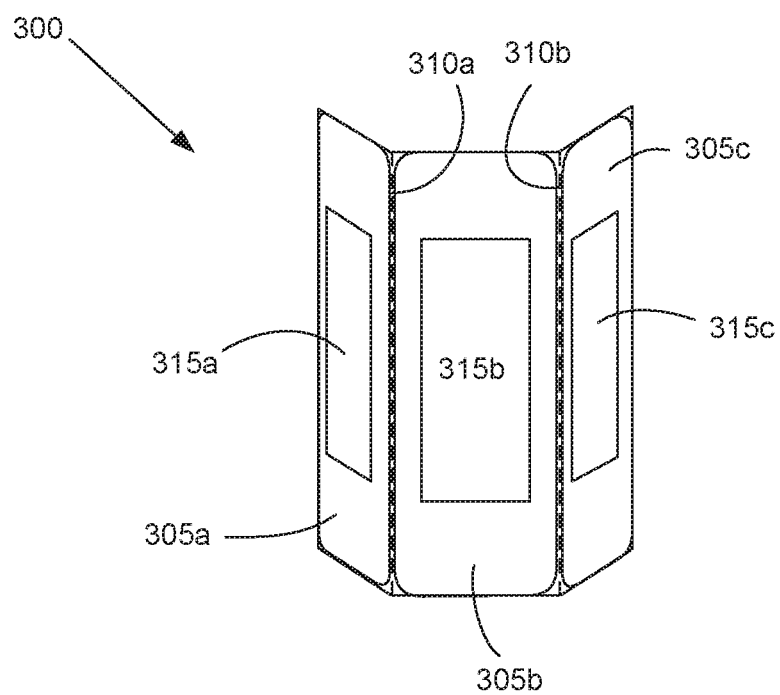

It should be appreciated that the modular sensing apparatus 200 may include a wide variety of designs and form factors. FIGS. 3A and 3B describe an additional embodiment. In FIGS. 3A and 3B, the modular sensing apparatus 300 includes three plates 305a/305b/305c. There is a sensor 315a/315b/315c on each plate. Connecting mechanisms 310a/310b (e.g., fold lines) couple the plates with one another. In the illustrated embodiment, the connecting mechanisms form lines that extend parallel to one another. As indicated in FIG. 3B, the modular sensing apparatus 300 can be folded along those lines.

FIG. 3A represents a flat configuration, in which the plates 305a-c and/or sensors 315a-c collectively form a single, substantially coplanar surface. As a result, the faces of the sensors 315a-c face in the same direction i.e., upward and out of the page. In FIG. 3B, the modular sensing apparatus 300 is reconfigured and folded along the connecting mechanisms 310a/310b to form a different configuration, in which the plate 305*b* forms a top surface and the plates 305*a* and 305*c* form (opposing) side surfaces that can extend perpendicular to the top surface.

In some embodiments, when the modular sensing apparatus 300 is in this configuration, it is positioned over a top edge or rim of a display panel. An example of such usage is illustrated by apparatus 300 in FIG. 1A. (In various other embodiments, modular sensing apparatus 300 in FIG. 1A has the features and structure of modular sensing apparatus 200 of FIGS. 2B and 2C.) When the apparatus is folded and positioned over the top rim of the display panel 110, plate 305*a* and sensor 315*a* overlie the bevel of the display screen 115 on the front surface 150*b* of the display panel 110 (FIG. 1C.) Plate 305*b* and sensor 315*b* overlie the top surface 150*a* of the display panel 110, while plate 315*c* and sensor 305*c* overlie the back surface 150*d* of the display panel 110. Due to this configuration and placement, the apparatus 300 is able to detect motion in front, above and behind the display panel e.g., in regions that overlie the front, top and back surfaces of the display panel 110.

Referring next to FIGS. 4A-4C and 5A-5C, various motion detection zones according to various embodiments of the present invention will be described. FIGS. 4A-4C pertain to the modular sensing apparatus 400 illustrated in FIG. 4A, which is arranged in a flat configuration. That is, the apparatus is not folded but instead is generally flat, with multiple sensors 405 on its top surface that face generally in the same upward direction.

FIGS. 4B and 4C illustrate a motion detection zone 410 for the sensors on the modular sensing apparatus 400. FIG. 4B illustrates a motion detection zone 410 as seen from the perspective of side 420 of the apparatus 400, while FIG. 4C illustrates the motion detection zone from the perspective of side 425 of the apparatus.

One notable feature of the zone is that although there are multiple sensors on the surface of the apparatus that are separated by a non-sensor substrate, there are no associated breaks in the motion detection zone. This illustrates that each sensor is arranged to detect motion in a region that directly overlies the face of the sensor. Each sensor, however, also is capable of detecting motion in regions slightly to the sides of that region, which is indicated by the curved shape of the zone.

Thus, in some embodiments, it can be desirable to position multiple sensors in an array or row, as seen in the sensors 405 of FIG. 4A or sensors 210*c-e* of FIG. 2A. Because the motion detection zone tends to "bulge" to the sides, even if there are spaces between sensors in a sensor array, the sensors are collectively capable of detecting any motion in a continuous region that overlies the entire sensor array. (This characteristic is generally applicable to capacitive and field sensing sensors e.g., optical, magnetic, ultrasonic, etc., although it may not be true for all types of sensors.) Thus, the sensor array need not be replaced with a single, larger sensor, which may involve more hardware and expense.

FIG. 5A illustrates a modular sensing apparatus 500 that is folded in a shape similar or identical to that of the modular sensing apparatus 200 of FIG. 2C. Modular sensing apparatus 500 may have any of the characteristics, features and/or sensors of the apparatus 200 of FIG. 2C. FIGS. 5B and 5C are views from different sides of the apparatus illustrated in FIG. 5A (e.g., from sides 520 and 525, respectively.) The folding of the apparatus 500 forms a trench 530 that is arranged to be fitted over a rim of a device (e.g., display panel 110 of FIG. 1A.)

FIGS. 5B and 5C illustrate how this folded configuration affects the motion detection zone 510 of the apparatus. Because of the folding along the connecting mechanisms (e.g., connecting mechanisms 220*c* and 220*d* of FIG. 2C), the faces of the sensors 505 are oriented in different directions. Thus, the motion detection zone 510 covers a continuous region that extends more than 180° around the top surface of the apparatus. In some embodiments, the motion detection zone 510 is a single continuous region that overlies substantially all surfaces with sensors on them.

The above figures generally involve plates or sections that are coupled with one another along lines, which can be folded to form sharp angles and edges. The folding enables the sensors on the plates to face in different directions and detect motion in different zones around the apparatus. However, it should be appreciated that the modular sensing apparatus may take a variety of different forms that depart from what has been illustrated in these figures. Some designs, for example, do not involve folding and/or involve reconfiguring the modular sensing apparatus to assume a curved shape. Such shapes are suitable for fitting on a curved or cylindrical device. Examples of such designs will be discussed later in the application (e.g., in connection with FIG. 12.)

Figure 6:
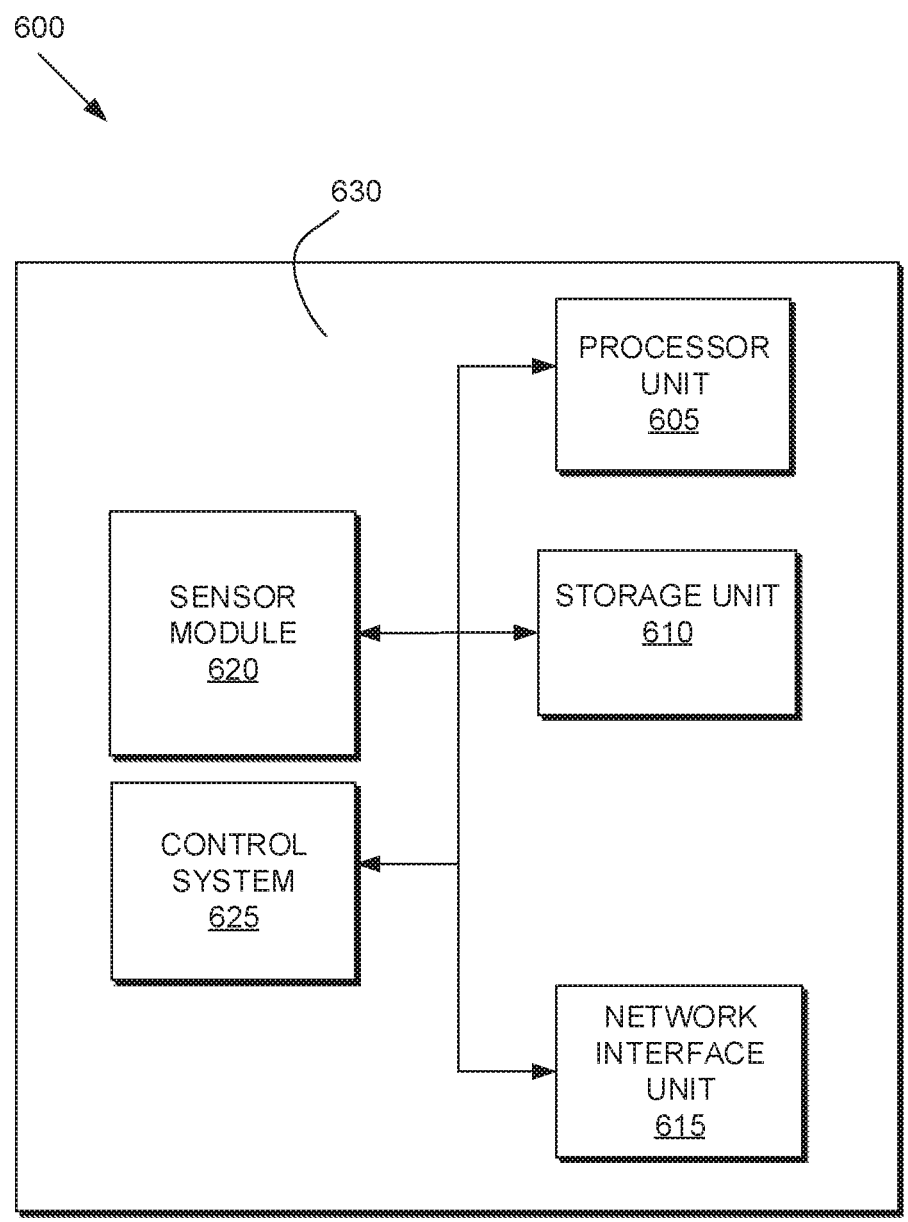
FIG. 6 is a block diagram of a modular sensing apparatus according to a particular embodiment of the present invention.

The modular sensing apparatus may also include circuitry and other integrated electronics that allow it to process sensor/motion data and transmit the data to one or more other devices. Referring next to FIG. 6, a block diagram of the modular sensing apparatus 600 is described. The modular sensing apparatus 600, which may be any modular sensing apparatus described herein (e.g., apparatus 200 of FIGS. 2A-2D) includes a processor unit 605 having one or more processors, a substrate 630, a storage unit 610, a network interface 615, a sensor module 620 and a control system 625.

The substrate 630 may be made from any suitable non-conductive material. As previously discussed, in some embodiments, the substrate 630 is flexible such that the modular sensing apparatus can be reconfigured into different shapes (e.g., flat, corner-conforming, rim-conforming, etc.) to match or conform to different structures or surfaces. As previously discussed, the substrate 630 may include multiple plates that are coupled with one another using connecting mechanisms. Examples of the substrate were shown as substrate 205 in FIG. 2A.

The sensor module 620 includes one or more sensors. Each sensor may be any suitable type of sensor, such as a motion sensor or a capacitive sensor. As previously discussed, in various implementations, the sensors are arranged over multiple plates so that when the substrate is reshaped or folded, the faces of the sensors face in different directions, thus enabling the sensors to detect motion in different zones surrounding the apparatus.

The control system 625 is any circuitry, hardware or software that is suitable for managing the operations of the modular sensing apparatus 600. In various embodiments, for example, the control system 625 is arranged to analyze the sensor data that is received from the sensor module 620. In some embodiments, the control system 625 determines that a particular type of motion (e.g., a motion that extends around the corner of a device or over the top rim of the device, a wave, a swipe, etc.) took place in a particular zone around the device. The control system 625 is then arranged to transmit data to the device to cause the device to perform a particular operation based on the detected motion.

In various implementations, the control system 625 is also arranged to detect what type of configuration the modular sensing apparatus is in (e.g., a flat configuration, a corner-conforming configuration as illustrated in FIG. 2D, a rim-conforming configuration as illustrated in FIG. 2C, etc.) The type of configuration may affect how the control system processes or interprets sensor data. By way of example, when the apparatus determines that the apparatus is in a flat configuration, it may operate like a trackpad, mouse, 2D and/or 3D interactive surface. When the apparatus determines that it is positioned on a device in a particular configuration, it is arranged to track or detect motion around the covered surface of the device.

The storage unit 610 is any hardware or software suitable for storing data or executable computer code. The storage unit 610 can include but is not limited to a hard drive, flash drive, non-volatile memory, volatile memory or any other type of computer readable storage medium. By way of example, any of the operations described above in connection with the control system or the method of FIG. 7 may be encoded in the form of computer code or some other type of instructions in the storage unit. The execution of the computer code or instructions by the processor unit 605 causes the modular sensing apparatus 600 to perform the aforementioned operations or methods.

The network interface unit 615 is any hardware or software that helps the modular sensing apparatus 600 communicate with external devices. In various implementations, for example, the network interface unit 615 is arranged to transmit motion detection data and/or sensor data to a device that the modular sensing apparatus is positioned on. The network interface unit 615 may also transmit and receive RF signals and use received signals to detect the location and presence of other modular sensing apparatuses on the device. The network interface unit 615 is arranged to transmit and receive data using any suitable wired or wireless network (e.g., LAN, Internet, etc.) or communications protocol (e.g., Bluetooth, WiFi, NFC, IEEE 802.15.4, IEEE 802.11, etc.)

Figure 7:
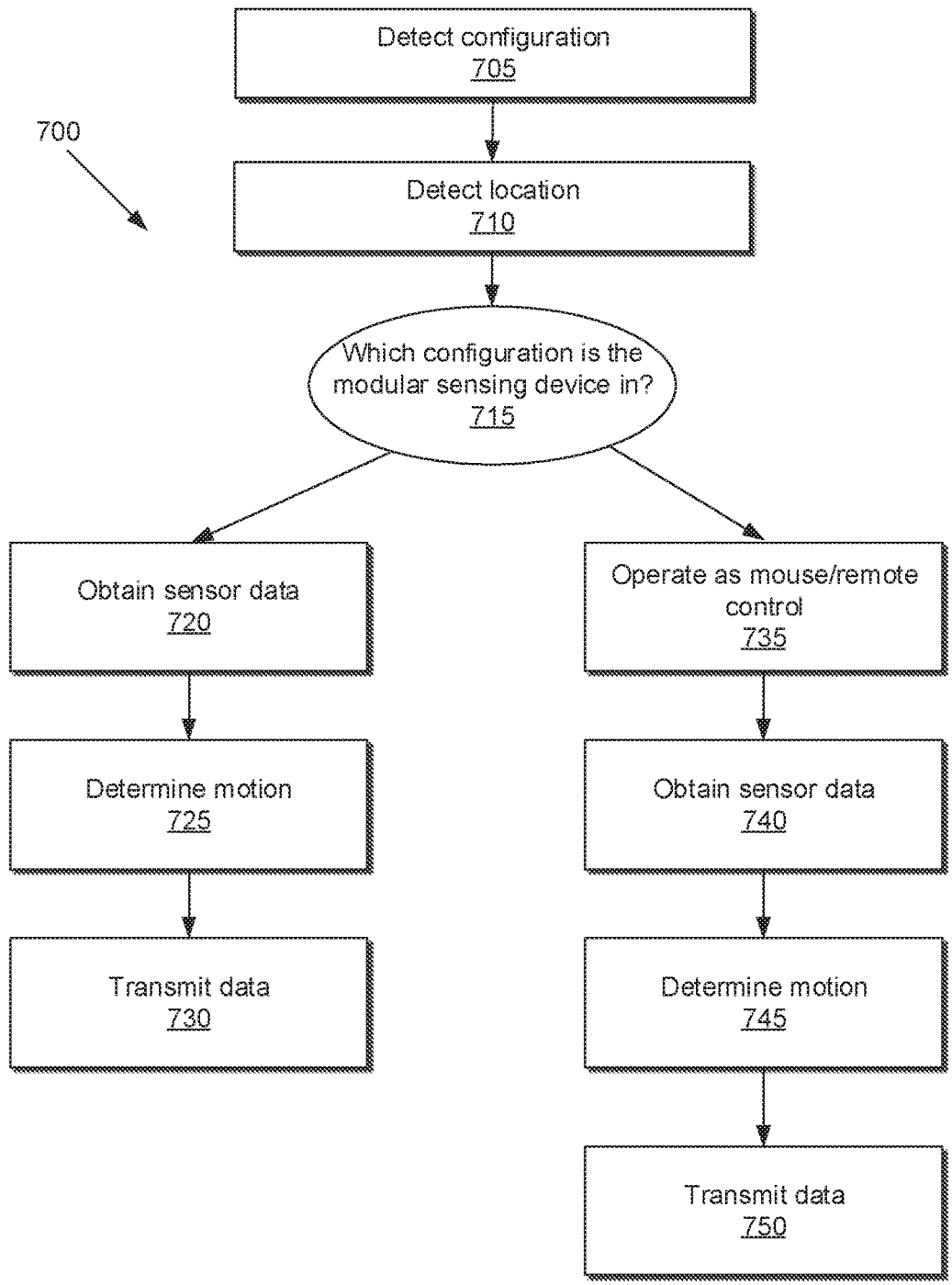
FIG. 7 is a flow diagram illustrating a method for operating a modular sensing apparatus according to a particular embodiment of the present invention.

Referring next to FIG. 7, a method 700 for controlling a modular sensing apparatus according to a particular embodiment of the present invention will be described. In this example, the method 700 is performed using the modular sensing apparatus 200 and device 100 of FIGS. 1A-1C and 2A-2D, although in other implementations any suitable modular sensing apparatus or device may be used. It should be appreciated that the illustrated method indicates only an example implementation, and may be modified as appropriate for different applications.

At step 705, the modular sensing apparatus 200 detects its configuration. That is, it determines whether the apparatus is in, for example, a flat configuration, a corner-conforming configuration (e.g., FIG. 2D), a rim conforming configuration (e.g., FIG. 2C), or any other suitable configuration. The apparatus 200 may also determine whether it is placed flat on a surface such as a table, or whether it is positioned on a corner, rim or some other portion of a device 100. The apparatus may make this determination in any suitable manner. For example, the apparatus may include internal switches, buttons or sensors that detect when the apparatus has been reshaped into different configurations. As will be discussed in further detail below, the type of configuration or shape that the modular sensing apparatus 200 is in can affect the way in which data is received and/or processed.

At step 710, the modular sensing apparatus 200 determines its location (e.g., on a rim of the device, at the corner of a device, etc.). This may be performed in a variety of ways. In some embodiments, for example, the apparatus 200 will determine its own location based on its configuration (e.g., an apparatus in a corner-conforming configuration determines that it is positioned at a corner of a device). In still other embodiments, the modular sensing apparatus 200 forms a sensor network with other apparatuses positioned on the same device 100. Each apparatus generates an RF signal/field and may determine its location and/or the location of other apparatuses by, for example, detecting the shape or strength of the field generated by the other apparatuses. An example implementation of such a sensor network will be described in greater detail below in connection with FIG. 16.

For the purpose of this example, the apparatus 200 may be in one of two configurations: (1) a flat configuration, in which all of the plates and sections of the apparatus are not folded and are arranged such that their surfaces are substantially coplanar with one another (e.g., as seen in FIG. 2A); and (2) a corner-conforming configuration, in which the apparatus 200 is positioned at a corner of a display panel 110 and is arranged to cover four sides/surfaces at the corner of the display panel 110 (e.g., as seen in FIGS. 2D and 1A-1C.) Of course, it should be noted that the apparatus 200 may be reconfigured into many different types of shapes and configurations, and that the above two are intended to be understood as example implementations.

At step 715, the apparatus 200 determines whether it is in a corner-conforming configuration. If that is the case, at step 720, it obtains sensor data from the sensors e.g., sensors 210a-210h of FIG. 2A. Generally, the sensor data is capable of indicating a motion in three dimensions, and may be received from multiple sensors.

At step 725, based on the received sensor data, the modular sensing apparatus 200 determines what type of motion was detected. By way of example, the modular sensing apparatus 200 may receive data from multiple sensors, detecting a motion that went over the top of a display panel, or around the side of the display panel (e.g., as discussed in connection with FIGS. 1A and 1B.) For instance, in the example apparatus illustrated in FIG. 2D, sensors 210h, 210i and 210b may detect a continuous motion that triggered the sensors in that order (step 720). Since the apparatus is in a corner-conforming configuration, such sensor data is interpreted as a curved, swiping motion that started at a front surface of a display panel 110, went over the top surface of the display panel and finished over the back surface (e.g., as indicated by the arrow 140 of FIG. 1B.) (It should be noted that if the apparatus 200 in FIG. 2D is symmetrical and is reoriented or flipped, a different set of sensors may detect the same type of motion.)

At step 730, the modular sensing apparatus 200 then transmits data indicating the motion to the device 100. The apparatus 200 may also transmit data indicating its location or arrangement, as determined in steps 705-710. Additionally or alternatively, the modular sensing apparatus 200 transmits a command to the device based on the detected motion. By way of example, if the display panel is playing or displaying an e-book, blog or digital magazine, and the modular sensing apparatus 200 detects a motion that moves around the side of the display panel 110, the modular sensing apparatus 200 may transmit a command signal indicating that a page of the media should be turned. The method 700 then returns to step 705.

Returning to step 715, if the modular sensing apparatus determines that the apparatus 200 is in a flat configuration, the method proceeds to step 735. At step 735, the modular sensing apparatus 200 operates as a mouse, trackpad or remote control to control the device. This means that the apparatus 200 may interpret sensor data differently than if it was in corner-conforming configuration, as will be described below.

At step 740, the modular sensing apparatus 200 obtains sensor data from its sensors. This step is performed generally the same as in step 720.

At step 745, the modular sensing apparatus 200 determines a motion based on the sensor data. The determination of the motion may differ based on the configuration of the apparatus 200. For instance, in the previous example described in connection with step 725, the sensors 210h, 210i and 210b detected a motion that passed over them in sequence. As previously noted, if the apparatus 200 were in a corner-conforming configuration, this motion may be interpreted as a curved swipe that travels over the top of a display panel. However, since the apparatus is in a flat configuration, as shown in FIG. 2B, the motion is interpreted as a linear motion that extends across the flat surface of the apparatus 200.

At step 745, the modular sensing apparatus 200 then transmits data indicating the detected motion and/or transmits a command to the device based on the detected motion. If the latter, then the command that is transmitted may be based in part on the configuration that the modular sensing apparatus 200 is in. As indicated above, if the modular sensing apparatus 200 is in a corner-conforming configuration, then the example motion described above (a hand sweep around the edge of a display panel) may be translated into a page turn of digital media. Since the modular sensing apparatus is in a flat configuration, the same motion may be translated into a different command (e.g., a command to move a cursor up on a screen, a channel switch, etc.)

Figure 8:
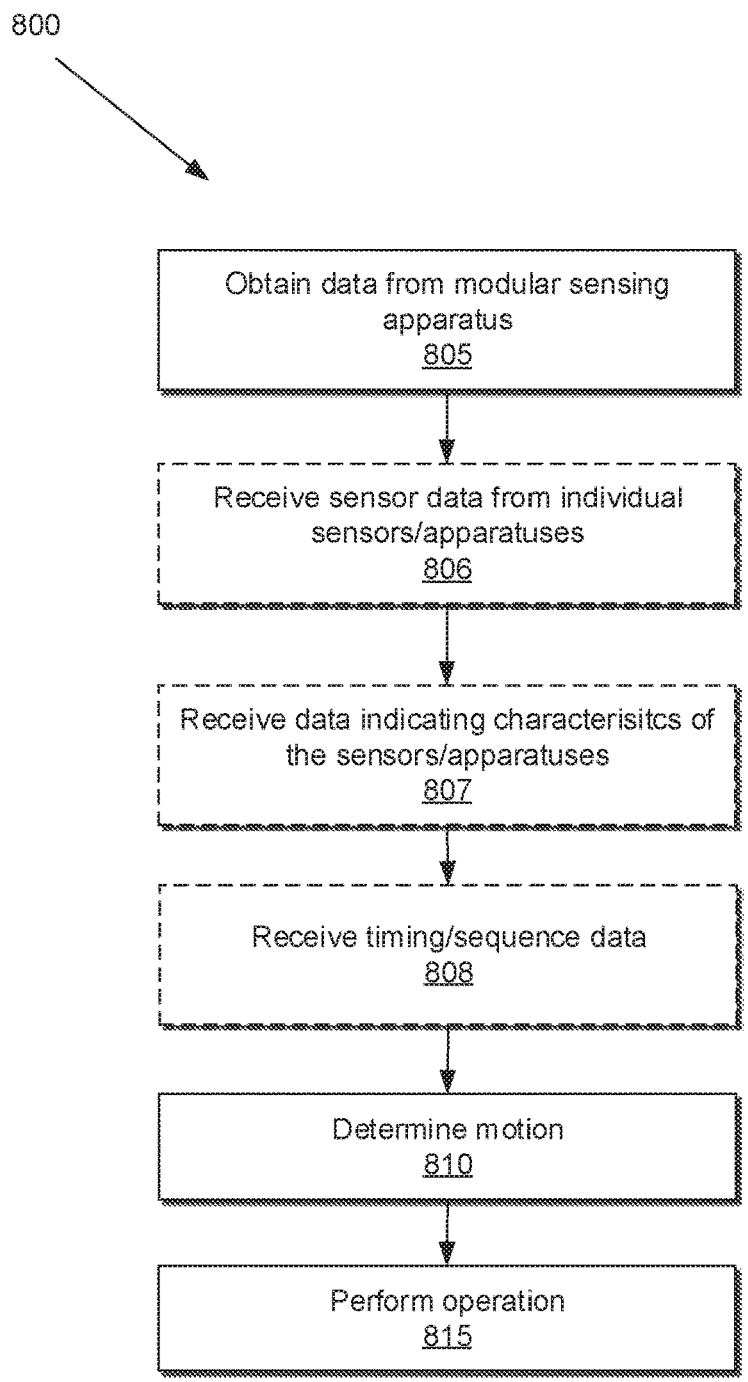
FIG. 8 is a flow diagram illustrating a method for operating a device according to a particular embodiment of the present invention.

Referring next to FIG. 8, a method 800 of controlling a device 100 according to a particular embodiment of the invention will be described. This method 800 is performed by a device 100 that a modular sensing apparatus 200 is positioned on and/or is communicating with. Thus, the method 800 may be performed by any device described in this application e.g., the device 100 of FIGS. 1A-1B.

At step 805, the device 100 receives sensor data from one or more modular sensing apparatuses (e.g., apparatuses 200 of FIGS. 1A-1B and 2A-2D). The data may take a variety of forms. In some embodiments, for example, the sensor data is the raw data obtained by the sensors, which the device 100 processes and interprets. In other embodiments, the device 100 obtains data from the modular sensing apparatus 200 indicating a particular motion or command (e.g., a swipe of the hand around a corner of the display device, a command to flip a page, etc.)

Optional steps 806, 808 and 808 indicate examples of the types of sensor data that may be received. Consider the example in FIG. 1B, in which a motion extends over the top corner of a display panel (e.g., as indicated by the arrow 140). In such a situation, the device 100 may receive data indicating the following events: (1) a first part of motion, which is detected by a front surface sensor 210h of the corner-conforming apparatus 200; (2) a second part of the motion, which is detected by a top surface sensor 210i of the apparatus 200; and (3) a third part of the motion, which is detected by the back surface sensor 210b of the apparatus 200.

At optional step 807, the device may receive data indicating characteristics of the sensors or apparatus(es) that transmitted the sensor data. By way of example, the device 100 may also receive data indicating the locations/IDs of those sensors, what they detected and/or the configuration that the apparatus is in. At optional step 808, the device 100 may also receive data indicating the timing of the detected events and the order/sequence of those events.

At step 810, the device 100 determines a particular motion based on the received data. In various embodiments, this step may involve analyzing location, configuration and/or sensor data to determine the exact nature of the motion, while in other embodiments, the nature of the motion is predetermined by the modular sensing apparatus 200. In the above example, based on this information, the device 100 determines that the hand was waved in an arc over the top corner of the display panel 110.

At step 815, the device 100 performs a particular operation that is associated with the motion. By way of example, a particular motion (e.g., a motion that passes over the top of a display panel) may be associated with flipping a page of an e-book displayed on the device 100, while another may be associated with increasing or decreasing volume on the playing of media. In various embodiments, any suitable device command may be associated with and customized for any motion. Various example motions and their associated commands in the context of different types of media applications are described later in the application (e.g., in connection with FIGS. 9A-14B).

FIGS. 9A-9B, 10A-10C, 11A-11B, 12, 13A-13B and 14A-14B associate various motions with particular types of commands. Any of the aforementioned operations and methods that involve transmitting a command or performing an operation based on a particular kind of detected motion may involve one of these associations (e.g., steps 720-730 and 735-750 of FIG. 7, steps 805-815 of FIG. 8, etc.)

FIGS. 9A-9B involves an example arrangement in which multiple modular sensing apparatuses 200 are positioned on edges of a device, which in the illustrated embodiments is a display panel 110. (For example, the display panel 110 may be part of a laptop computer e.g., as with display panel 110 in FIG. 1A, or be the display panel of a tablet, television or monitor.) Each of the modular sensing apparatuses 200 may be the modular sensing apparatus 200 of FIG. 2A.

In FIG. 9A, a user waves a hand outward and away from the right side of the display panel. This "push out" motion is detected by one or more sensors of a modular sensing apparatus 200 that is positioned on the right side of the display panel. By way of example, sensor 210f or 210i of FIGS. 2A-2D is arranged to detect such a motion, when the apparatus is in the rim-conforming configuration of FIG. 2C. In this particular embodiment, media content is displayed on the device e.g., an e-book, a digital magazine, a blog, pages of a website, etc. When the modular sensing apparatus 200 detects the motion (e.g., steps 720 and 725 of FIG. 8), it transmits a command to the device (step 730) to go to the next page or set of content.

In FIG. 9B, a user waves a hand inward and towards the right side of the display panel. This "push in" motion is similarly detected by one or more sensors of the modular sensing apparatus 200 that is positioned on the right side of the display panel (e.g., sensor 210f or 210i of FIGS. 2A-2D.) In this particular embodiment, when the motion is detected/determined (e.g., steps 720 and 725 of FIG. 8), the modular sensing apparatus transmits a command to the device (e.g., step 730) to go back i.e., to a previous page or set of content, reveal a hidden GUI drawer, etc.

FIGS. 10A-10C involves a motion in which a user holds his hand over a sensor of a modular sensing apparatus 200 that is positioned on a top surface of the display panel 110. By way of example, sensors 210f/210i of FIG. 2C would be able to detect such a motion. The hand must be held in place for at least a predetermined period of time. In this particular embodiment, media (e.g., a movie) was being played on the screen and is currently paused (FIG. 10A.) When the modular sensing apparatus 200 detects/determines the above hand gesture (FIG. 10B) (e.g., steps 720 and 725 of FIG. 7, the modular sensing apparatus transmits a command to the device (e.g., step 730) to toggle the pausing/un-pausing of the media (FIG. 10C.) That is, if the media is currently paused, as shown in FIG. 10A, the holding of the hand over the sensor will un-pause the media and the media will continue playing. If the media is currently playing, then the holding of the hand over the sensor will instead pause the media.

Figure 11A:
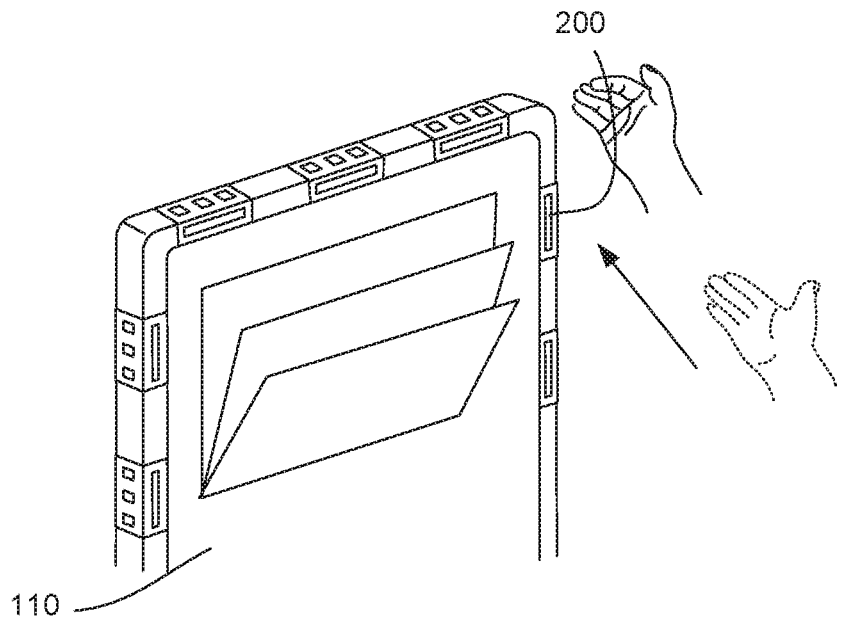
Figure 11B:
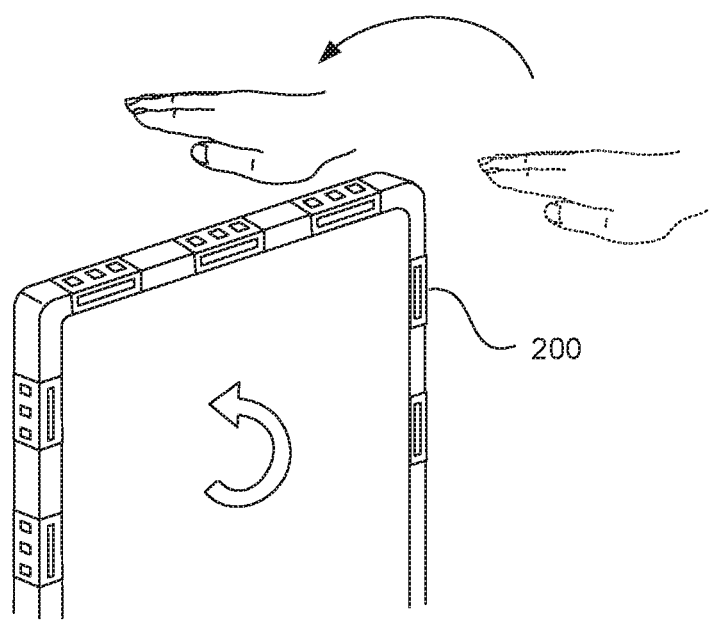

FIGS. 11A-B involve a device with a display panel 110 that is displaying media e.g., media such as an e-book, digital magazine, digital folder, cards or blog, that is flippable or that is organized in successive cards or pages, where a user can move forward and back through the cards/pages. In FIG. 11A, a user is making a front to back motion with his or her hand at the right side of the display panel 110. This motion may occur along a single horizontal plane. This front to back motion is similarly detected by one or more sensors of a modular sensing apparatus 200 that is positioned on the right side of the display panel (e.g., sensor 210f/210i of FIG. 2C.) In this particular embodiment, when the apparatus 200 detects/determines the motion (e.g., steps 720 and 725 of FIG. 8), the modular sensing apparatus 200 transmits a command to the device (e.g., step 730) to go forward or flip forward i.e., to the next page/set of content. In FIG. 11B, the user is performing a rotational motion. The rotational motion in this example starts from the side of the display panel 110 and ends at the top of the display panel 110 (e.g., it may pass around the side corner of the display panel, similar to the motion indicated by arrow 125 in FIG. 1A.) In various embodiments, this motion takes place in a vertical plane that is perpendicular to the aforementioned horizontal plane. When this motion is detected/determined, the apparatus 200 transmits a command to the device to go backward or flip backward e.g., to a previous page/set of content.

Referring next to FIG. 12, a modular sensing apparatus 1200 according to another embodiment of the present invention will be described. The modular sensing apparatus 1200 is quite different from the design illustrated in FIG. 2A. In FIG. 12, the apparatus 1200 is formed from a flexible substrate that can be reshaped to form a curved surface. When reconfigured in this manner, the shape of the apparatus is able to conform to a cylindrical device, such as the cylindrical electronic device illustrated in FIG. 12.

The modular sensing apparatus 1200 is reconfigured to form a top, circular surface 1210 and a curved side surface 1215 that forms a ring. The apparatus 1200 is thus configured to slide over and match the contours of the underlying cylindrical device 1205. There are sensors 1220a/1220b positioned on the side curved surface and the top surface. As a result, the apparatus 1200 is able to detect motion over the top surface, as well as 360° around the side surface e.g., around a midpoint axis of the apparatus 1200. The substrate, components, and sensors of the apparatus 1200 may otherwise be similar to or the same as those of the apparatus 200 of FIGS. 2A-2D.

Figures 13A, 13B:
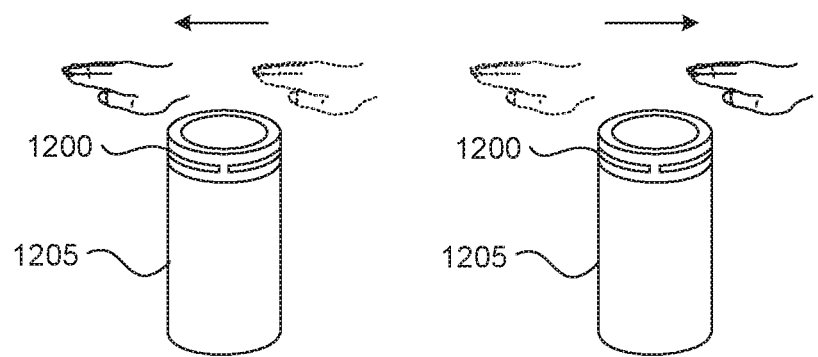
FIGS. 13A-13B and 14A-14B are diagrams indicating various example ways of interacting with the device and modular sensing apparatus illustrated in FIG. 12.

FIGS. 13A-13B and 14A-14B illustrate various ways of interacting with the cylindrical device 1205. Consider an example in which the cylindrical electronic device 1205 is a speaker system arranged to generate audio (e.g., play a music/audio file.) As shown in FIG. 13A, a user can rewind the audio by swiping left. This swiping may occur over the sensor 1220b on the top surface 1210 of the device 1205, or below the top surface and over the sensor(s) 1220a on the side surface 1215 of the device 1205. Alternatively, as shown in FIG. 13B, the user can swipe to the right in those locations, which causes the audio to fast forward.

Figures 14A, 14B:
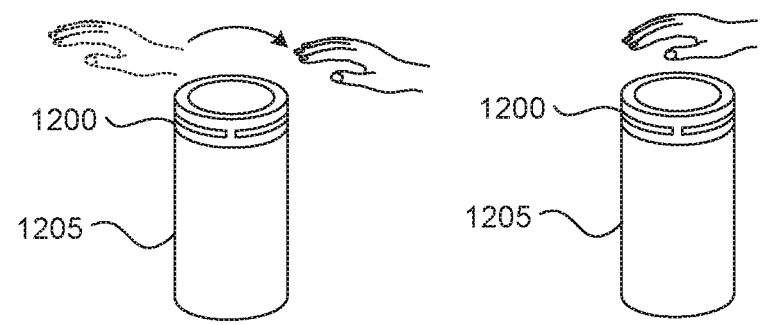

In FIG. 14A, the user moves his or her hand clockwise around the top surface 1210 of the modular sensing apparatus 1200 (e.g., while the hand is overlying the sensor 1220b of the top surface.) Alternatively, the user moves his or her hand clockwise around the side surface 1215 of the apparatus (e.g., while the hand is overlying the sensor(s) 1202a on the side surface.) This clockwise motion is translated into an increase in volume of the audio played at the device 1205. Alternatively, if the same motion is used but in a counterclockwise direction, the volume is decreased.

FIG. 14B illustrates another motion-based command. In FIG. 14B, the user holds his or her hand over the sensor 1220b on the top surface 1210 of the modular sensing apparatus 1200. Generally, the hand is held for at least a predetermined period of time. When this is detected by the apparatus 1200, the apparatus 1200 and/or the device 1205 determines that the user wishes to toggle the pausing of the playing of audio from the device.

Each of the above motion-operation associations may be used together with the methods of FIGS. 7 and 8 and the modular sensing apparatuses of FIGS. 1A-1B, 2A-2D, and/or 12 as appropriate. By way of example, the modular sensing apparatus 1200 detects one of the above motions using one and sometimes multiple sensors, determines the nature of the motion (e.g., step 720 and 725 of FIG. 7) and then transmits the associated command/motion/sensor data to the device (e.g., step 730.) The device then performs the associated operation (e.g., step 815 of FIG. 8)

Referring next to FIGS. 15A and 15B, a display panel assembly according to a particular embodiment of the present invention is described. In some of the aforementioned example implementations, the modular sensing device is a separate product that may be placed on any number of suitable devices. In other implementations, the modular sensing device is integrated into the manufacturing and/or assembly of an electronic device. That is, during manufacturing or assembly, the modular sensing device is applied to a part of the device (e.g., a corner or rim of a display panel.) In some embodiments, a non-conductive material is positioned over the modular sensing device to help protect it and/or to hide it from view.

FIGS. 15A-15B illustrates an example display panel assembly, which includes a display screen 1505 that is positioned on a display panel 1510. A modular sensing apparatus 1515 is positioned on a portion of the panel 1510 (e.g., the corner of the display panel 1510 or the top rim of the display panel 1510, as shown in the figure.) In the illustrated embodiment, the depicted apparatus 1515 may be the apparatus 200 of FIG. 2A, folded into one of the configurations illustrated in FIGS. 2C and 2D. The apparatus 1515 may be reconfigured and/or positioned on the display panel as previously described, for example, in connection with FIGS. 1A-1C.

In some modern display panels, there is a bevel surface 1520 between the edge of the panel and the screen. This space between the edge of the underlying panel and the edge of the screen can be quite small or (almost) non-existent. Thus, when the modular sensing apparatus 1515 is positioned on the top rim of the panel 1510, a particular plate or portion of the apparatus 1515 may extend beyond the bevel into the area that would be covered by the screen. This is shown more clearly in FIG. 15B, which is a side perspective of the panel 1510, modular sensing apparatus 1515 and screen 1505 illustrated in FIG. 15A.

The screen 1505 is attached to the panel 1510, and the screen 1505 overlies a portion of the modular sensing apparatus 1515, as shown in FIG. 15B. Although the screen covers a portion/plate of the modular sensing apparatus 1515 and/or its associated sensors, the screen does not prevent the sensors from detecting motion in front of the panel. In some embodiments, the substrate that the modular sensing apparatus 1515 is made at least partially of a transparent material, so that it cannot be easily seen through the screen 1505. This allows the modular sensing apparatus 1515 to be easily integrated even into display panels that have very limited space between the edge of the screen and the border of the panel.

Referring next to FIG. 16, a sensor network 1600 according to a particular embodiment of the present invention will be described. The sensor network includes multiple modular sensing apparatuses 1605. Each apparatus may be the same, for example, as the apparatus 200 illustrated in FIG. 2A. The apparatuses are positioned on a device 1615. In this example, the device is a laptop computer and the apparatuses 1605 are positioned at the corners and rims of a display panel (e.g., as in FIG. 1B), although in other embodiments any suitable device and arrangement may be used. The apparatuses may be configured and positioned on the display panel as previously discussed in connection with FIGS. 1A-1C.

Each modular sensing apparatus 1605 is arranged to detect motion in a zone 1610 around the apparatus 1605, as indicated by the circles. By positioning multiple apparatuses together on the same device, much of the area in front of, above and behind the display panel are covered by at least one and possibly multiple such zones 1610. Overlapping coverage can allow for higher resolution and better tracking of motion.

The apparatuses may be connected using any suitable network protocol e.g., WiFi, Bluetooth, Zigbee, LAN, etc. In various implementations, the apparatuses are arranged to use the network to share data indicating their position, configuration and/or arrangement. In some embodiments, each modular sensing apparatus 1605 detects the shape or strength of RF signals received from other apparatuses. Each apparatus 1605 may use such signal characteristics to help determine the relative position and arrangement of one or more apparatuses (e.g., as discussed in connection with step 705 of FIG. 7.)

The sensor network 1600 may be controlled in any suitable manner. In some embodiments, for example, a particular modular sensing apparatus 1605 serves as the master sensor. Alternatively, an external device or a mesh network architecture may be used.

Figure 17:
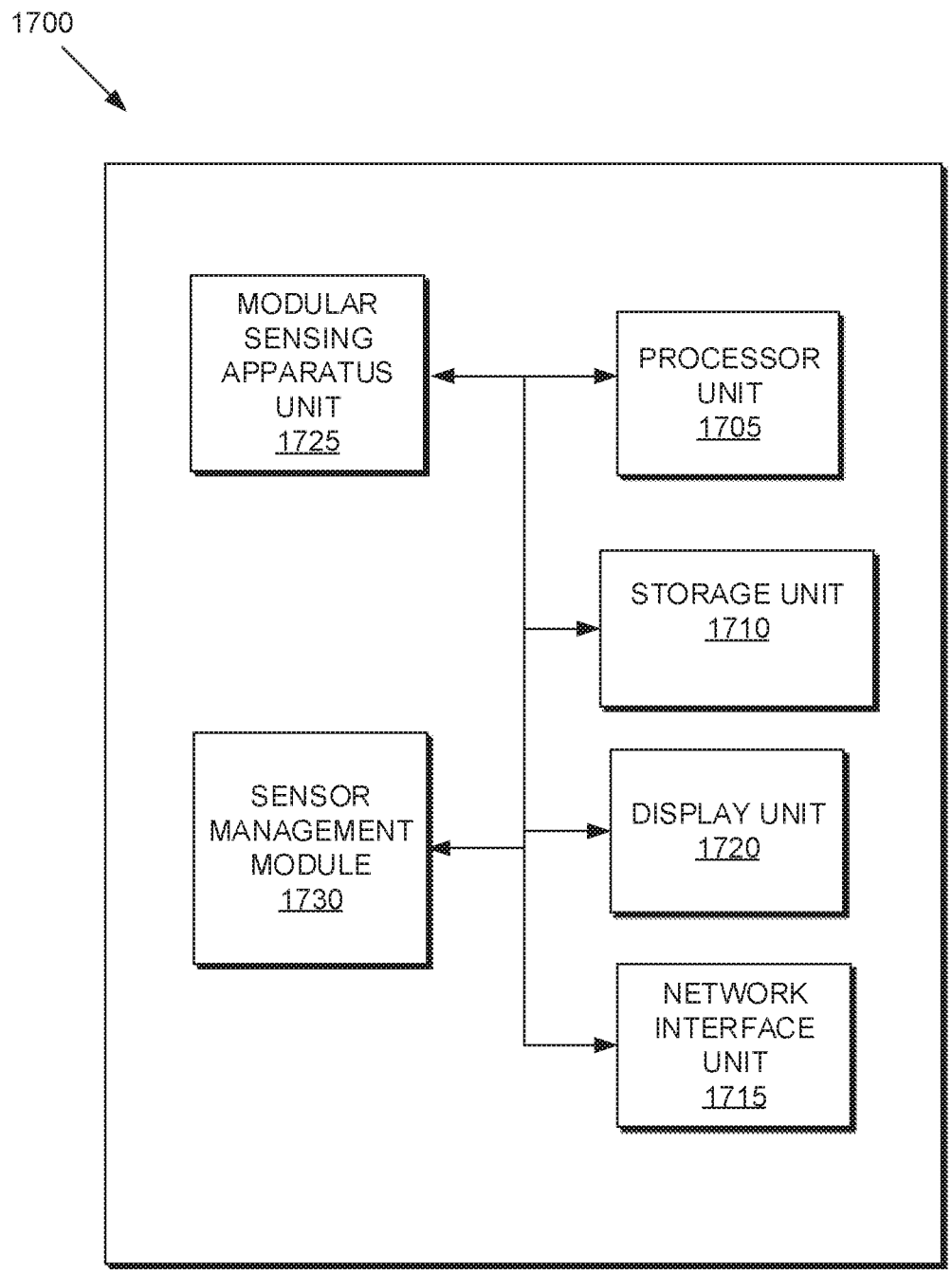
FIG. 17 is a block diagram of a device according to a particular embodiment of the present invention.

Referring next to FIG. 17, a device 1700 according to a particular embodiment of the present invention will be described. The device 1700 may be, for example, the device 100 of FIGS. 1A and 1B. The device 1700 may be any suitable computing device, including but not limited to a television, a display panel, a laptop computer, a monitor and a computer tablet. The device 1700 includes a processor unit 1705 having one or more processors, a display unit 1720, storage unit 1710, a modular sensing apparatus unit 1725, a network interface unit 1715 and a sensor management module 1730.

The optional module sensing apparatus unit 1725 includes one or more modular sensing apparatuses. Each modular sensing apparatus may be the same or similar to the apparatus 200 of FIGS. 1A and 2A-2D or any other apparatus described herein. The apparatus 200 is arranged to obtain sensor data, detect motion and transmit the sensor/motion data to the device and the sensor management module (e.g., as described in method 700 of FIG. 7). In some embodiments, the module sensing apparatus(es) is/are positioned on the device 1700 but are not part of it i.e., they can be easily removed or separated from the device. In other embodiments, the apparatus(es) is/are integrated into the device 1700 (e.g., as discussed in connection with FIG. 15.)

The sensor management module 1730 is any hardware or software suitable for performing any operation described herein that pertains to the device (e.g., method 800 of FIG. 8.) In various embodiments, the sensor management module 1730 is arranged to process sensor, motion, configuration and/or location data received from the modular sensing apparatus unit 1725 and perform operations based on the data.

The storage unit 1710 is any hardware or software suitable for storing data or executable computer code. The storage unit 1710 can include but is not limited to a hard drive, flash drive, non-volatile memory, volatile memory or any other type of computer readable storage medium. Any operation or method for the device that is described in this application (e.g., method 800 of FIG. 8) may be stored in the form of executable computer code or instructions in the storage unit 1710. The execution of the computer code or instructions by the processor unit 1705 causes the device 1700 to perform any of the aforementioned operations or methods.

The network interface unit 1715 includes any hardware or software suitable for enabling the device 1700 to communicate with external devices e.g., the modular sensing apparatuses. In various embodiments, for example, the device 1700 receives sensor, location, configuration and/or motion data from a modular sensing apparatus through the network interface unit 1715. The network interface unit 1715 is arranged to transmit data and receive data using any suitable network (e.g., LAN, Internet, etc.) or communications protocol (e.g., Bluetooth, WiFi, NFC, IEEE 802.15.4, IEEE 802.11, etc.)

The optional display unit 1720 is any hardware or software suitable for displaying an image, media and/or an interface. In some embodiments, for example, the display unit 1720 includes a display panel and a display screen (e.g., display panel 110 and display screen 115 of FIG. 1A). The display screen is positioned on a front surface of the panel. In various implementations, there is a bevel between the screen edge and the outer edge of the front surface of the display panel. The panel also includes a top surface, side surfaces and a back surface. In some embodiments, a modular sensing apparatus is positioned such that it overlies and overlaps a portion of the bevel, the screen, the top surface, the side surface and/or the back surface of the display panel. Any display-related operation or command described herein can be performed using the display unit. The display unit 1420 may include any suitable display technology e.g., a touch sensitive (capacitive) screen, an e-ink display, an LCD or OLED display or any other suitable display technology.

In this application, there are descriptions of operations that are performed at a device or a modular sensing apparatus (e.g., device 100 and apparatus 200 of FIG. 1A.) It should be appreciated that any operation described as being performed at the device may also/instead be performed at the modular sensing apparatus, and vice versa. In some embodiments, for example, the apparatus obtains sensor data and transmits it the device. The device then determines the motion that the sensor data indicates and/or a command associated with the motion (e.g., playing media, toggling pause, increasing volume, moving a cursor, etc.) In other embodiments, the modular sensing apparatus, rather then the device, determines the motion indicated by the sensor data and/or the device command. It then transmits data indicating the motion and/or device command to the device.

There are various descriptions in this application of a modular sensing apparatus that includes a substrate/plate. The substrate/plate physically supports a sensor e.g., as discussed in connection with FIGS. 2A and 2B. The surface of the substrate/plate and the face of the sensor are sometimes described as being substantially coplanar. This may mean that the face of the sensor and the surface of the substrate/plate may be truly coplanar. However, this can also mean that the face of the sensor may be raised above or positioned below the surface of the substrate. Put another way, if a first reference plane is coplanar with the face of a sensor and a second reference plane is coplanar with the surface of a substrate/plate that is adjacent to and/or physically supports the sensor, the first and second reference planes are either coincident or parallel with one another. It should be noted that the above arrangements are not requirements, and may optionally apply to any description of a substrate/plate and sensor described herein (e.g., the plates and associated sensors described in connection with FIGS. 2A-2D.)

In this application, there are references to a modular sensing apparatus that conforms to a structure or surface (e.g., a structure or service of a device, such as a display panel.) This may mean different things in different implementations. In some implementations, the modular sensing apparatus closely conforms to the contours of the structure or surface. It may, for example, be adhered with or positioned flush against the surface and/or tightly fit the contours of a corner of a panel. In other embodiments, the modular sensing apparatus conforms to a surface/structure such that it is generally shaped to match, fit or hang upon the surface/structure, although it may not tightly adhere to or be positioned flush against every part of the structure/surface. In some embodiments, for example, the modular sensing apparatus is folded to hang on a rim of a device panel. The folding allows the apparatus to hang on the rim, but there may be some space between some parts of the underside of the apparatus and the surface of the rim.

In this application, there are various references to the term, "surface." It should be appreciated that in some embodiments, a single surface represents a single flat or curved surface. Thus, two surfaces can meet to form an edge; four surfaces can meet or cooperate to form a corner of a cube.

For some implementations, the drawings may be understood as describing proportions, orientations or arrangements that are not specifically addressed in the written description. For example, in FIG. 2A, the sensors, connecting lines and/or plates may be understood as being arranged symmetrically along an axis of symmetry for the apparatus. In another example, in FIGS. 5A-5C, particular surfaces of the apparatus 500 appear to and thus may be understood as being arranged perpendicular to one another.

Although only a few embodiments of the invention have been described in detail, it should be appreciated that the invention may be implemented in many other forms without departing from the spirit or scope of the invention. For example, the present application and figures describe various methods that perform particular operations. It should be appreciated that in some embodiments, one or more of these operations/steps may be modified, reordered and/or deleted. Additionally, some figures, such as FIGS. 2A-2D, 6 and 17, describe devices/systems that contain various components. It should be noted that in some embodiments, one or more of these components may be merged together. In still other embodiments, one or more components may be separated into a greater number of components. The features of one component may be transferred to another and/or modified as appropriate. Each device may have additional components beyond what is shown in the corresponding figure. Particular modules or devices that are shown as being part of a particular object may instead be coupled with the object e.g., with a wired or wireless connection. For example, in various implementations, all or almost all of the operations described in method 700 of FIG. 7 are performed by a modular sensing device. However, in still other embodiments, any of these operations may be performed by the device that the apparatus is positioned on, or another system that is coupled with the device. Therefore, the present embodiments should be considered illustrative and not restrictive and the invention is not to be limited to the details given herein.

What is claimed is:

1. A modular sensing apparatus comprising:
a flexible substrate configurable into different shapes that conform to differently-shaped three-dimensional structures, wherein the flexible substrate is arranged to fold to cover a plurality of surfaces that form a corner of a device; and
a plurality of sensors positioned on the flexible substrate with the plurality of sensors arranged on the flexible substrate to detect touchless motion-based commands in a region that overlies said sensors when the flexible substrate is positioned on at least two of said differently-shaped three-dimensional structures.

2. The modular sensing apparatus of claim 1, wherein the flexible substrate is further arranged to form a substantially flat, coplanar structure, and wherein the plurality of sensors are further arranged to detect the touchless motion-based commands over at least two different surfaces of the plurality of surfaces.

3. The modular sensing apparatus of claim 1, wherein the modular sensing apparatus is reconfigurable into one of a curved shape, or a cylindrical shape.

4. The modular sensing apparatus of claim 1, wherein the sensors are capacitive sensors.

5. The modular sensing apparatus of claim 1, wherein the flexible substrate includes a plurality of plates that are coupled to one another.

6. The modular sensing apparatus of claim 5, wherein the plurality of plates are coupled by one or more connecting mechanisms.

7. The modular sensing apparatus of claim 6, wherein at least one of the plurality of sensors is disposed on each one of the plurality of plates.

8. The modular sensing apparatus of claim 6, wherein the one or more connecting mechanisms includes one of: a hinge, a seam, a folding line, or a cutting line.

9. The modular sensing apparatus of claim 6, wherein the modular sensing apparatus is arranged to be reconfigured into at least a first or a second configuration;
in the first configuration, the plurality of plates and the flexible substrate help form a substantially coplanar surface; and
in the second configuration, the modular sensing apparatus is arranged to conform to a corner of a device.

10. The modular sensing apparatus of claim 9, further comprising:
a control system that is arranged to:
 detect whether the apparatus is in the first configuration or the second configuration;
 select an operation from a plurality of possible operations based at least in part on the detected configuration; and
 perform the selected operation.

11. The modular sensing apparatus of claim 9, wherein:
when the control system detects that the modular sensing apparatus is in the first configuration, the modular sensing apparatus is arranged to function as one of a mouse, remote control, or a trackpad used to control a device; and
when the control system detects that the modular sensing apparatus is in the second configuration, the modular sensing apparatus is arranged to detect motion over the corner and transmit, to a device data indicating the motion.

12. The modular sensing apparatus of claim 1, further comprising:
a network interface that is arranged to receive signals from one or more other modular sensing apparatuses; and
a control system that is arranged to determine, based on the received signals, a location of the modular sensing apparatus.

13. The modular sensing apparatus as recited in claim 1, wherein:
the modular sensing apparatus is arranged to form a top surface, a front surface, a back surface and a side surface to cover a corner of a device, the top surface being arranged substantially perpendicular to the front, back and side surfaces wherein the front and back surfaces are arranged substantially parallel to one another; and
each one of the front, side, top and back surfaces comprises at least one of the sensors.

14. A system, comprising:
a modular sensing apparatus including:
 a flexible substrate configurable into different shapes that conform to differently-shaped three-dimensional structures, wherein the flexible substrate is arranged to fold to cover a plurality of surfaces that form a corner of a device, and
 a plurality of sensors positioned on the flexible substrate with the plurality of sensors arranged on the flexible substrate to detect touchless motion-based commands in a region that overlies said sensors when the flexible substrate is positioned on at least two of said differently-shaped three-dimensional structures, wherein the modular sensing apparatus is a first modular sensing apparatus that is positioned on the device; and
a second modular sensing apparatus disposed on the device, wherein the first and second modular sensing apparatuses are coupled to one another through a network.

15. A device comprising:
at least two adjacent surfaces that help form a corner of the device;
at least one processor;
memory circuitry including a non-transitory computer readable storage medium that is arranged to store instructions wherein the instructions, when executed by the at least one processor, causes the device to:
 obtain sensor data from a plurality of sensors wherein at least one of the sensors is positioned over each of the adjacent surfaces that form the corner of the device, wherein the plurality of sensors are positioned on a flexible substrate of a modular sensing apparatus that is configurable into different shapes and that folds in order to conform to the at least two adjacent surfaces;
 based on the sensor data, determine a touchless motion that extends over the at least two adjacent surfaces including at least two surfaces of a front surface, a rear surface or a side surface; and
 based on the determined motion, perform an operation.

16. The device of claim 15, further comprising:
a display screen wherein one of the adjacent surfaces that helps form the corner of the device is a bezel of a display screen.

17. The device of claim 15, wherein the instructions, when executed by the at least one processor, further causes the device to:
receive a wireless signal from one or more of the plurality of sensors disposed on the at least two adjacent surfaces; and
determine a location based on the wireless signal.

18. A method for operating a modular sensing apparatus, the method comprising:
obtaining sensor data from a plurality of sensors positioned over a plurality of adjacent surfaces of a device, wherein a modular sensing apparatus having a flexible substrate that is configurable into different shapes and that folds in order to conform to at least two of the adjacent surfaces of the device, and wherein the plurality of sensors are positioned on the flexible substrate of the modular sensing apparatus;
based on the sensor data received from the plurality of sensors, determining a continuous touchless motion that extends over the plurality of adjacent surfaces including at least two surfaces of a front surface, a rear surface or a side surface; and
transmitting data to the device that causes the device to perform an operation that is based at least in part on the motion.

19. The method of claim 18, wherein:
the device includes a display panel and a display screen that is displaying media content; and
the transmitted data causes the device to adjust the displayed media content.

* * * * *